(12) United States Patent
Koike et al.

(10) Patent No.: US 12,419,198 B2
(45) Date of Patent: *Sep. 16, 2025

(54) MAGNETIC MEMORY

(71) Applicant: Kioxia Corporation, Tokyo (JP)

(72) Inventors: Masahiro Koike, Yokohama Kanagawa (JP); Michael Arnaud Quinsat, Yokohama Kanagawa (JP); Nobuyuki Umetsu, Kawasaki Kanagawa (JP); Tsutomu Nakanishi, Yokohama Kanagawa (JP); Agung Setiadi, Tokyo (JP); Megumi Yakabe, Kawasaki Kanagawa (JP); Shigeyuki Hirayama, Tokyo (JP); Masaki Kado, Kamakura Kanagawa (JP); Yasuaki Ootera, Yokohama Kanagawa (JP); Shiho Nakamura, Kawasaki Kanagawa (JP); Susumu Hashimoto, Tokyo (JP); Tsuyoshi Kondo, Kawasaki Kanagawa (JP)

(73) Assignee: Kioxia Corporation, Tokyo (JP)

(*) Notice: Subject to any disclaimer, the term of this patent is extended or adjusted under 35 U.S.C. 154(b) by 198 days.

This patent is subject to a terminal disclaimer.

(21) Appl. No.: 18/464,350

(22) Filed: Sep. 11, 2023

(65) Prior Publication Data

US 2024/0099155 A1   Mar. 21, 2024

(30) Foreign Application Priority Data

Sep. 20, 2022   (JP) .................................. 2022-149297

(51) Int. Cl.
*G11C 16/00*   (2006.01)
*G11C 11/16*   (2006.01)
(Continued)

(52) U.S. Cl.
CPC .......... *H10N 50/80* (2023.02); *G11C 11/161* (2013.01); *G11C 11/1673* (2013.01);
(Continued)

(58) Field of Classification Search
CPC .............. G11C 11/161; G11C 11/1673; G11C 11/1675; H10N 50/80; H10N 50/10; H10B 61/00
See application file for complete search history.

(56) References Cited

U.S. PATENT DOCUMENTS 6,862,215 B1 * 3/2005 Pancholy ................ G11C 11/16
365/158
9,153,340 B2   10/2015 Morise et al.
(Continued)

FOREIGN PATENT DOCUMENTS

JP   6172850 B2   8/2017
JP   6184680 B2   8/2017
(Continued)

*Primary Examiner* — Pho M Luu
(74) *Attorney, Agent, or Firm* — Finnegan, Henderson, Farabow, Garrett & Dunner, LLP

(57) ABSTRACT

A memory includes: a magnet including a first and second portions adjacent in a first direction. The first portion has a first dimension in a second direction at a first position at which a dimension of the magnet in the second direction is maximum, the second direction perpendicular to the first direction, the second portion has a second dimension in the second direction at a second position at which a dimension of the magnet in the second direction is minimum, the second dimension smaller than the first dimension, the first portion is continuous to the second portion via a third position between the first and second positions, a curve corresponding to an outer of the magnet extends between the first and third positions, and the curve passes through a side
(Continued)

closer to the central axis of the magnet than a straight line connecting the first and second positions.

17 Claims, 18 Drawing Sheets

(51) Int. Cl.
   *H10B 61/00* (2023.01)
   *H10N 50/10* (2023.01)
   *H10N 50/80* (2023.01)

(52) U.S. Cl.
   CPC .......... *G11C 11/1675* (2013.01); *H10B 61/00* (2023.02); *H10N 50/10* (2023.02)

(56) References Cited

U.S. PATENT DOCUMENTS

| | | |
|---|---|---|
| 9,184,212 B2 | 11/2015 | Morise et al. |
| 9,293,696 B2 | 3/2016 | Ootera et al. |
| 11,232,822 B2 | 1/2022 | Arnaud Quinsat et al. |
| 2020/0006422 A1* | 1/2020 | Yang ................. H10B 61/10 |
| 2021/0249061 A1* | 8/2021 | Arnaud Quinsat .......................... G11C 19/0841 |
| 2022/0077383 A1 | 3/2022 | Kondo et al. |

FOREIGN PATENT DOCUMENTS

| | | |
|---|---|---|
| JP | 6271350 B2 | 1/2018 |
| JP | 2021-125642 A | 8/2021 |
| JP | 2022-45204 A | 3/2022 |

\* cited by examiner

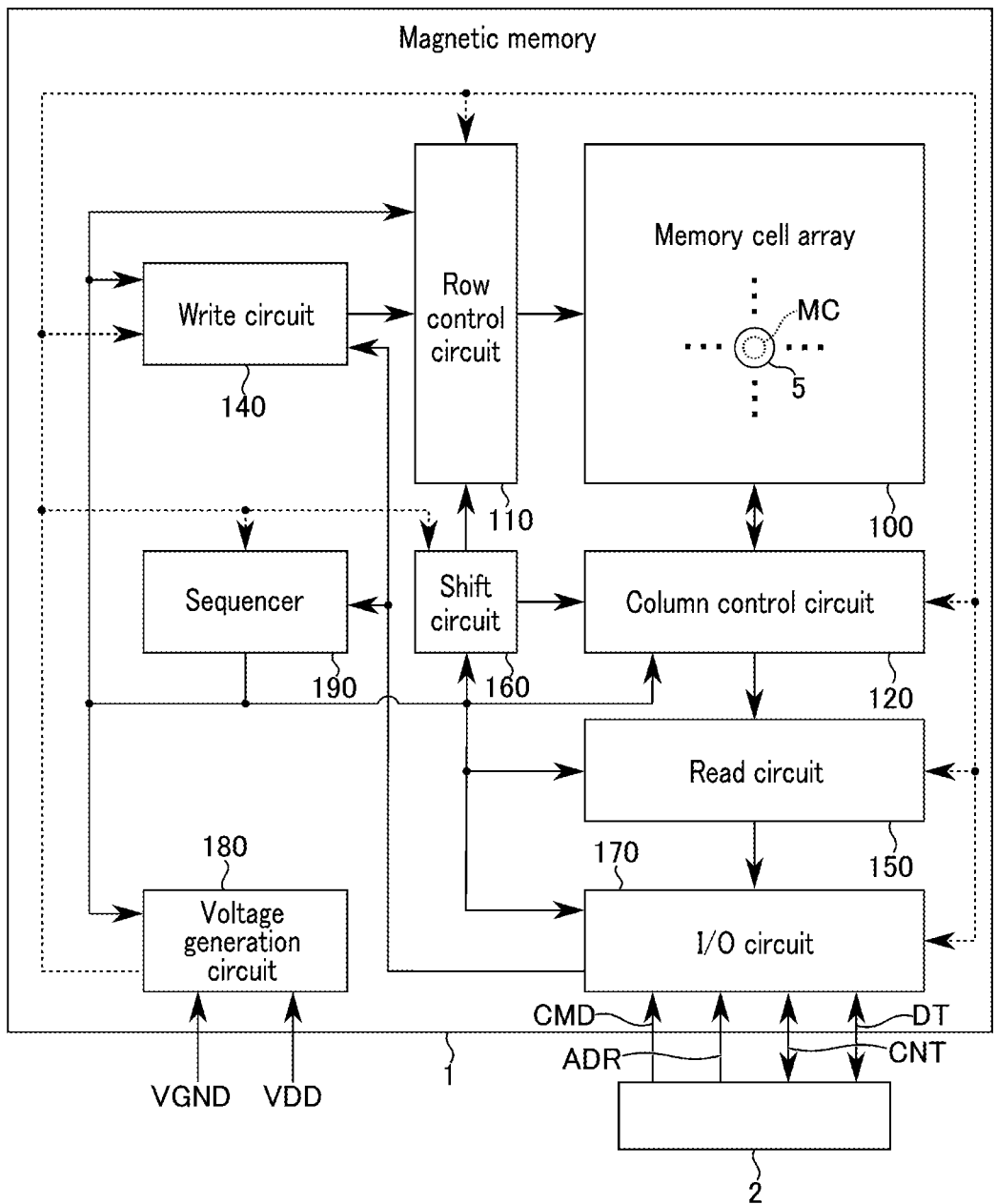
F I G. 1

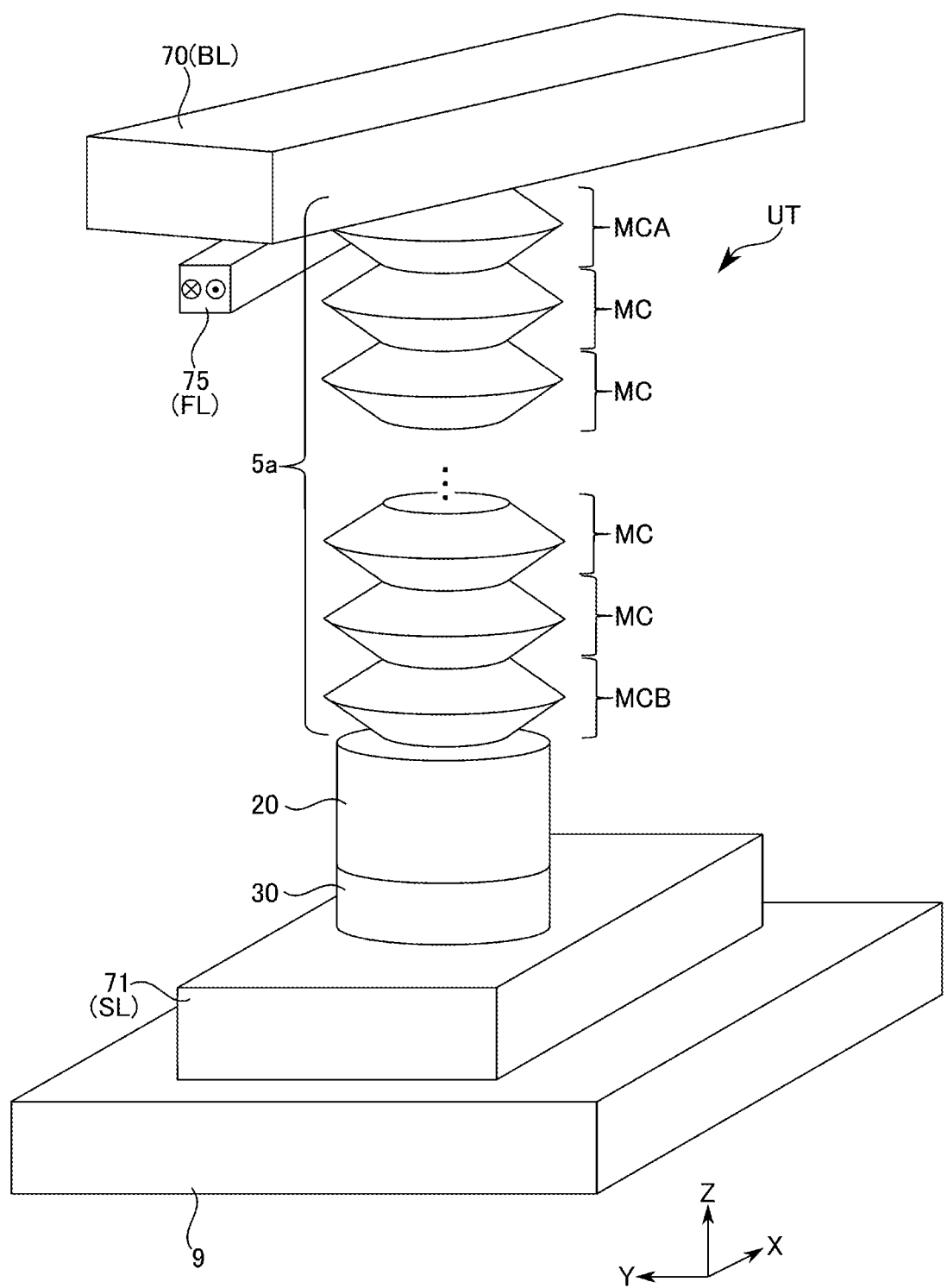
F I G. 3

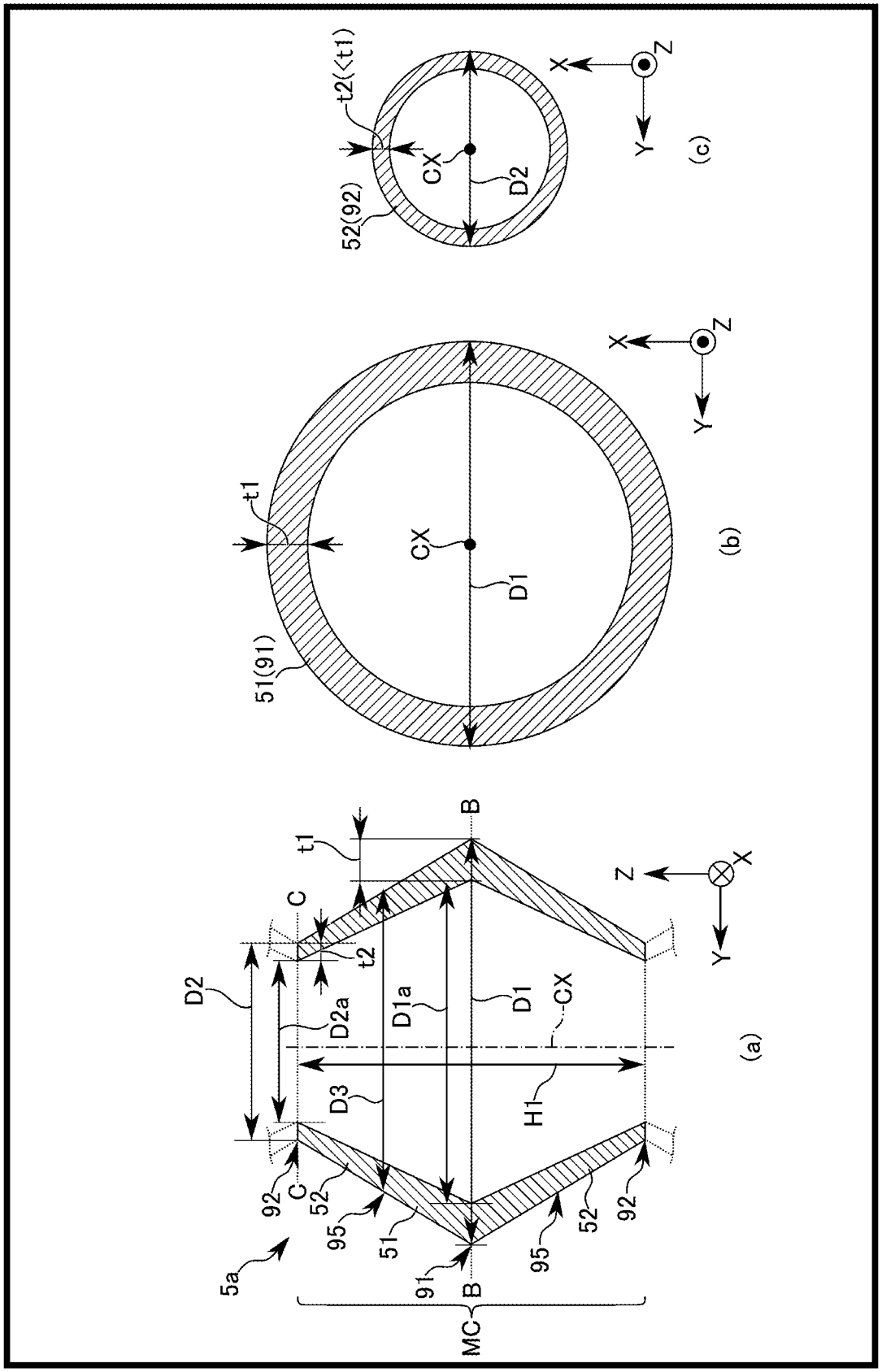
F I G. 5

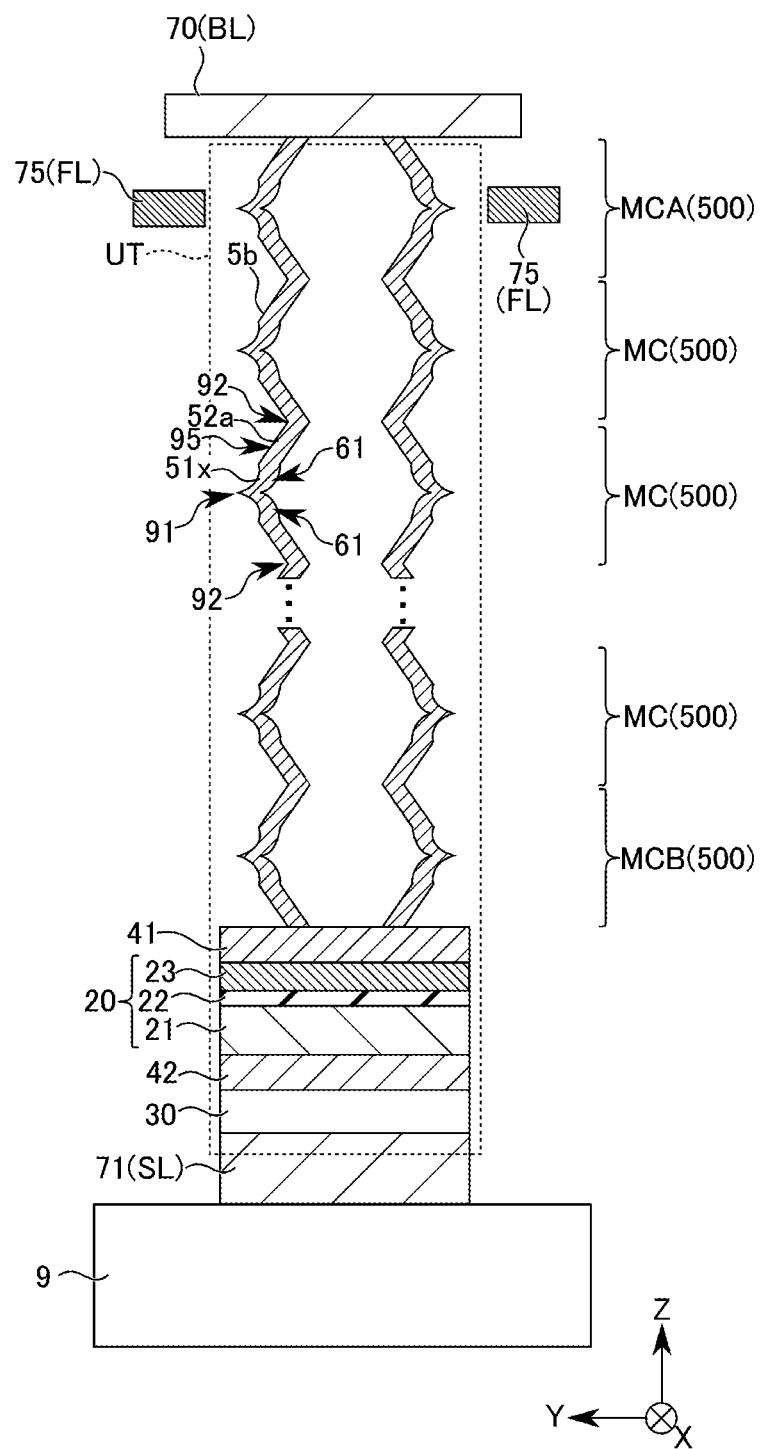
F I G. 11

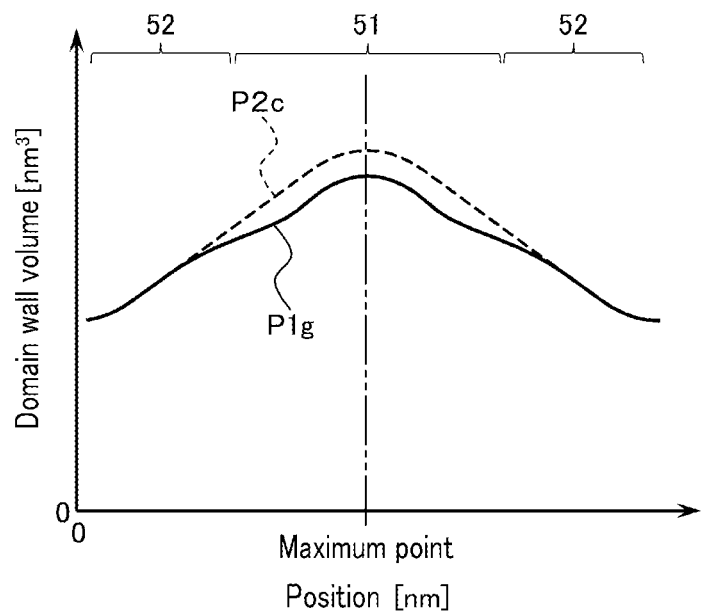
F I G. 15
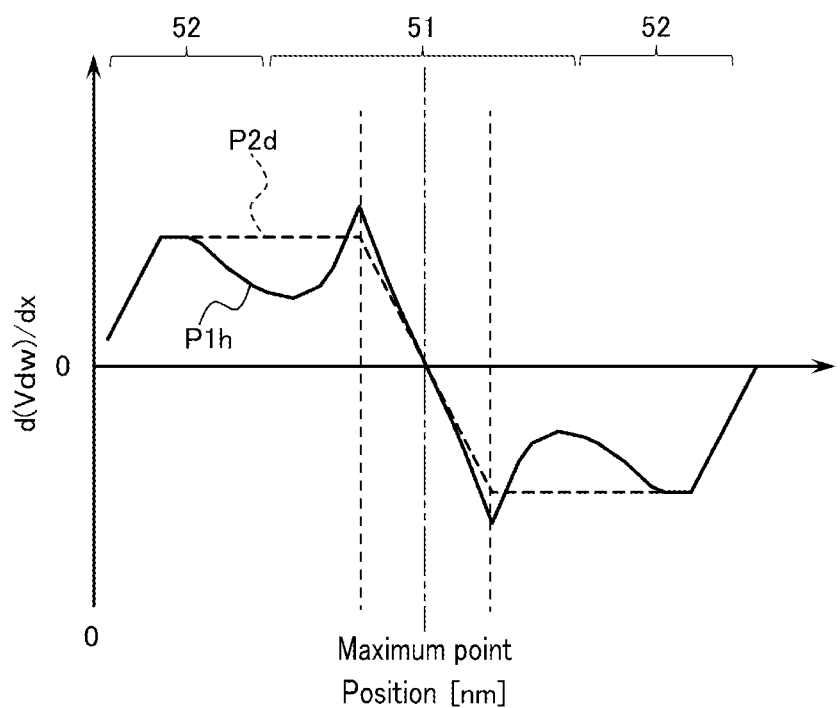
F I G. 16

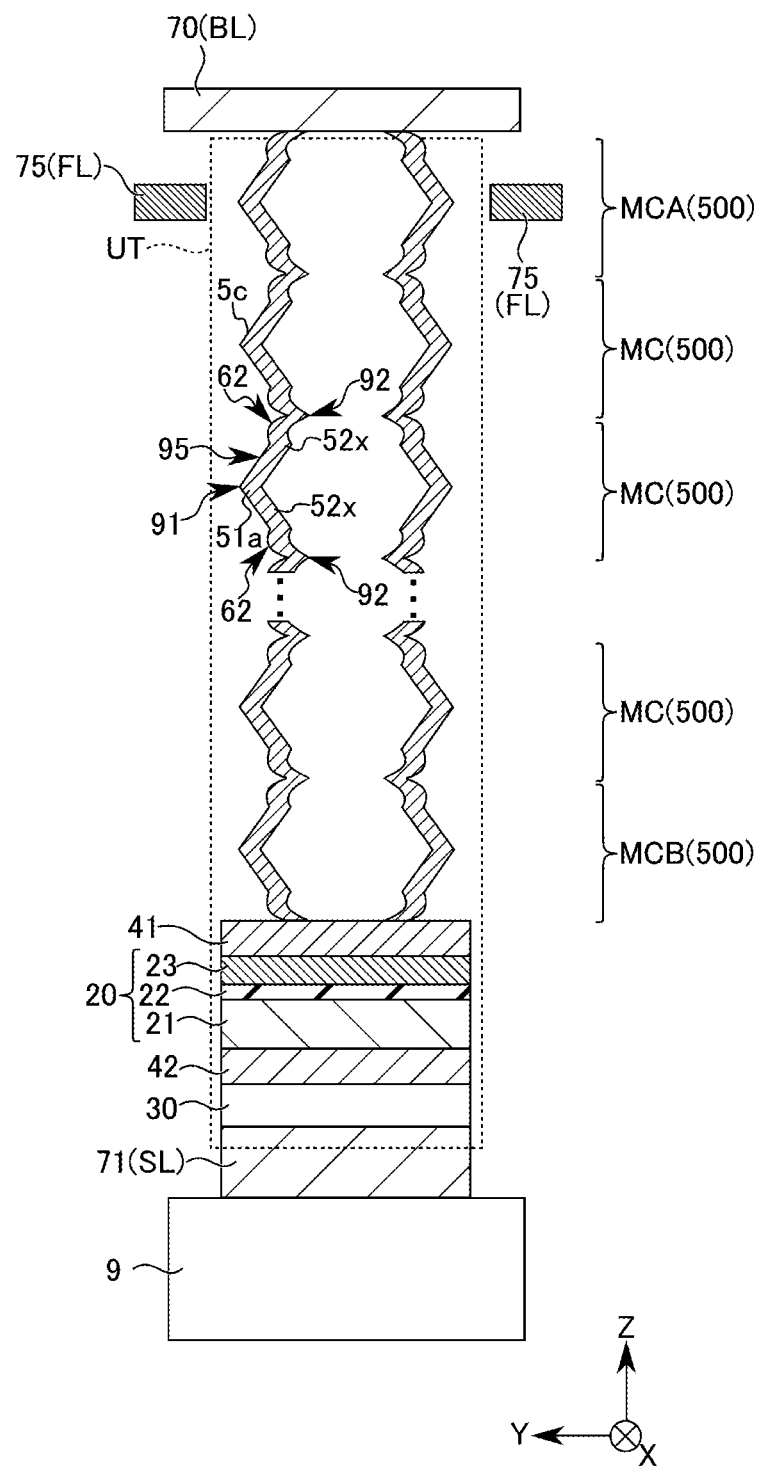
F I G. 17

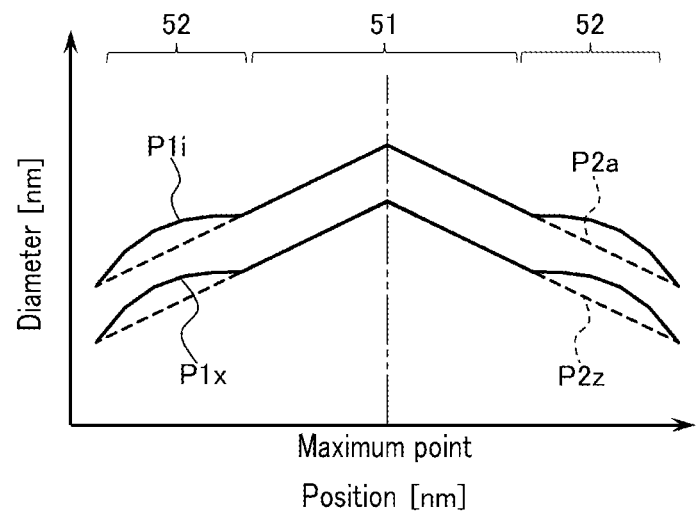
F I G. 19
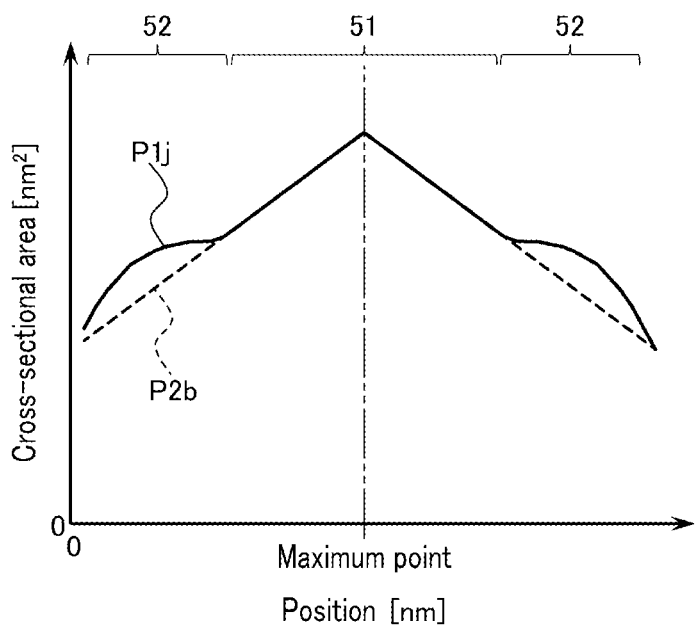
F I G. 20

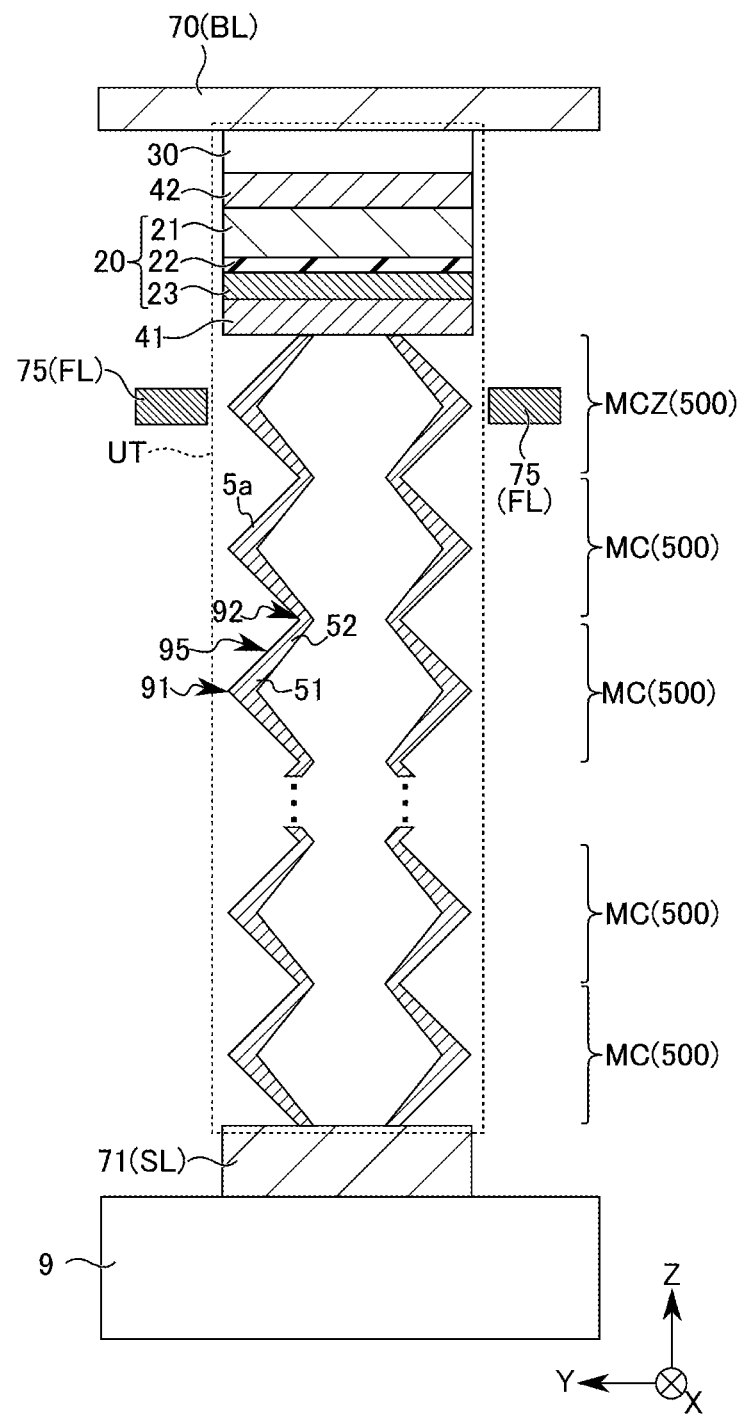
F I G. 23

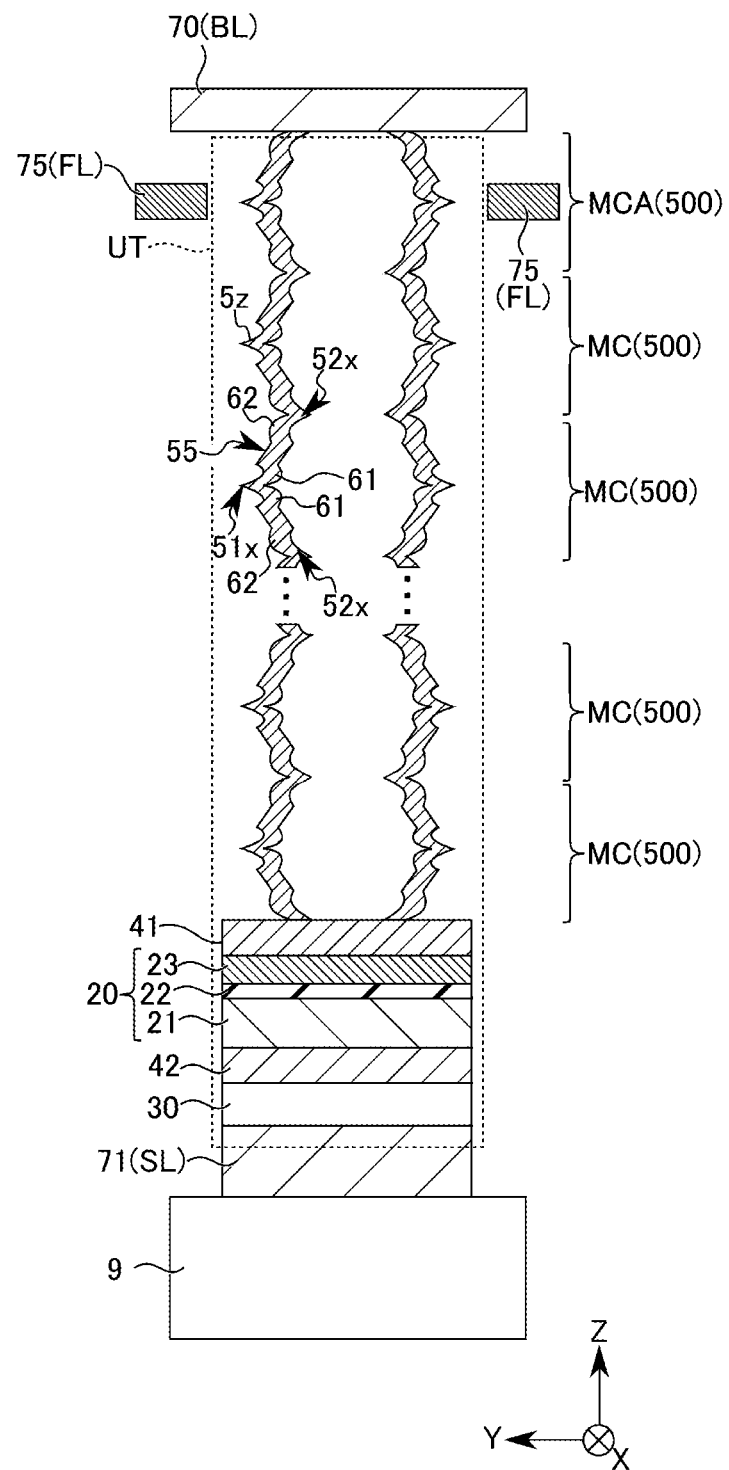
F I G. 24

MAGNETIC MEMORY

CROSS-REFERENCE TO RELATED APPLICATION(S)

This application is based upon and claims the benefit of priority from prior Japanese Patent Application No. 2022-149297, filed Sep. 20, 2022, the entire contents of which are incorporated herein by reference.

FIELD

Embodiments described herein relate generally to a magnetic memory.

BACKGROUND

A magnetic memory using magnetic wires has been researched and developed.

BRIEF DESCRIPTION OF THE DRAWINGS

FIG. 1 is a block diagram showing an overall configuration of a magnetic memory according to a first embodiment.

FIG. 3 is an overhead view showing an exemplary configuration of a memory cell unit in the magnetic memory according to the first embodiment.

FIG. 5 is a sectional view showing an exemplary configuration of a memory cell in the magnetic memory according to the first embodiment.

FIG. 11 is a sectional view showing an exemplary configuration of a memory cell unit in a magnetic memory according to a second embodiment.

FIG. 15 is a diagram showing characteristics of the magnetic memory according to the second embodiment.

FIG. 16 is a diagram showing characteristics of the magnetic memory according to the second embodiment.

FIG. 17 is a sectional view showing an exemplary configuration of a memory cell unit in a magnetic memory according to a third embodiment.

FIG. 19 is a diagram showing characteristics of the magnetic memory according to the third embodiment.

FIG. 20 is a diagram showing characteristics of the magnetic memory according to the third embodiment.

FIG. 23 is a diagram showing a modification of a magnetic memory according to the embodiments.

FIG. 24 is a diagram showing a modification of a magnetic memory according to the embodiments.

DETAILED DESCRIPTION

Figure 2:
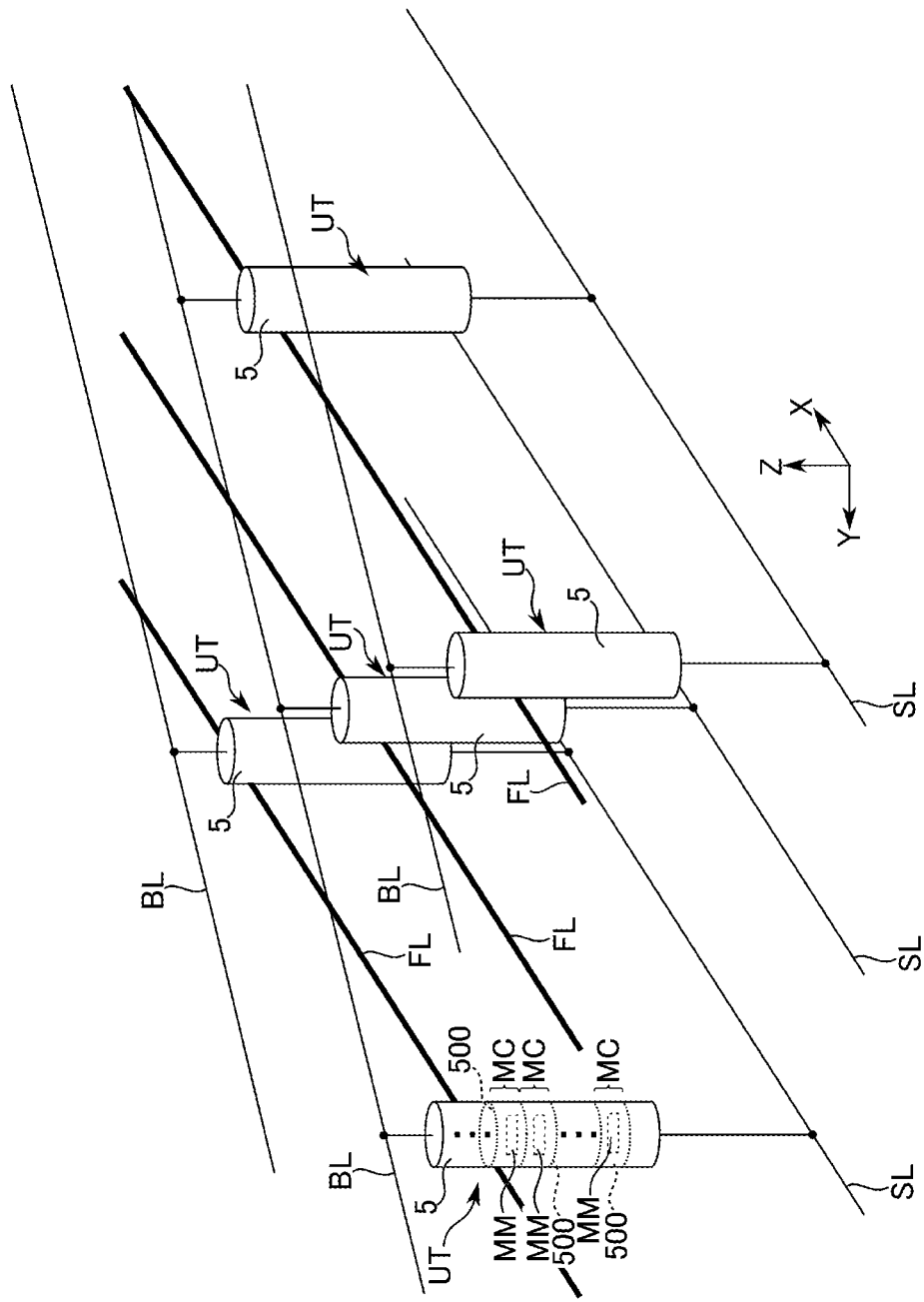
FIG. 2 is a schematic diagram showing an exemplary configuration of a memory cell array in the magnetic memory according to the first embodiment.

The embodiments will be described in detail with reference to the drawings. The description will use the same reference signs for elements or components having the same or substantially the same functions and configurations. In the following embodiments, when constituents (such as circuits, wirings, interconnects various voltages, and signals) having numerals/letters added at ends of reference numerals for differentiation are not necessarily distinguished from each other, an expression (reference numeral) in which the last number/letter is omitted is used.

In general, according to one embodiment, a magnetic memory includes: a tubular magnet including a first portion and a second portion adjacent to the first portion in a first direction; a write interconnect provided separately from the magnet; and a read element coupled to the magnet, wherein the first portion has a first dimension of the magnet in a second direction at a first position of the magnet, the first position being a position at which a dimension of the magnet in the second direction is maximum within the first portion, the second direction being perpendicular to the first direction, the second portion has a second dimension of the magnet in the second direction at a second position of the magnet, the second position being a position at which a dimension of the magnet in the second direction is minimum within the second portion, the second dimension being smaller than the first dimension, the first portion is continuous to the second portion via a third position between the first position and the second position, a curve corresponding to an outer peripheral surface of the magnet extends between the first position and the third position when viewed in the second direction, and the curve passes through a side closer to the central axis of the magnet than a straight line connecting the first position and the second position.

Embodiments

A magnetic memory of embodiments will be described with reference to FIGS. 1 to 24.

(1) First Embodiment

A magnetic memory of a first embodiment will be described with reference to FIGS. 1 to 10.

(a) Configuration Example

A configuration example of a magnetic memory according to the present embodiment is described with reference to FIG. 1 to FIG. 5.

FIG. 1 is a block diagram showing a configuration example of a magnetic memory 1 according to the present embodiment.

The magnetic memory 1 of the present embodiment is, for example, a domain-wall motion memory (also called "a domain-wall shift memory" or "a race-track memory"). In the magnetic memory 1 of the present embodiment, a magnetization direction of a magnetic domain and data are associated with each other. In the magnetic memory 1 of the present embodiment, a position of a domain wall (magnetic domain) in a magnet is moved in order to store data with a predetermined address.

As shown in FIG. 1, the magnetic memory 1 of the present embodiment includes a memory cell array (or may be called a "memory area") 100, a row control circuit 110, a column control circuit 120, a write circuit 140, a read circuit 150, a shift circuit 160, an I/O circuit 170, a voltage generation circuit 180, and a sequencer 190.

The memory cell array 100 includes a plurality of memory cells MC and a plurality of interconnects (for example, bit lines, source lines, and field lines). Each memory cell MC is coupled to one or more corresponding interconnects. The memory cell MC is formed using a magnet 5. The memory cell MC stores data.

The row control circuit 110 controls a plurality of rows of the memory cell array 100. The row control circuit 110 receives a result of decoding an address (row address). The row control circuit 110 sets a row (for example, an interconnect) selected based on the result of decoding the address to a selected state. Hereinafter, the row that is set to a selected state is referred to as a "selected row". The rows other than the selected row are referred to as "non-selected rows". For example, the row control circuit 110 includes a multiplexer, a switch circuit, and a driver circuit, etc.

The column control circuit 120 controls a plurality of columns of the memory cell array 100. The column control circuit 120 receives a result of decoding an address (a column address). The column control circuit 120 sets a column (for example, an interconnect) selected based on the result of decoding the address to a selected state. Hereinafter, a column (or a bit line) that is set to a selected state is referred to as a "selected column" (or a "selected bit line"). The columns other than the selected column are referred to as "non-selected columns" (or "non-selected bit lines"). For example, the column control circuit 120 includes a multiplexer, a switch circuit, and a driver circuit, etc.

The write circuit (also called a write control circuit or a write driver) 140 performs various controls for a write operation (data write). The write circuit 140 supplies a write pulse that is formed by a current and/or a voltage to the memory cell array 100. Data is thus written in the memory cell array 100 (selected memory cell MC).

For example, the write circuit 140 is coupled to the memory cell array 100 via the row control circuit 110. The write circuit 140 includes a voltage source and/or a current source, a pulse generation circuit, a latch circuit, and so on.

The read circuit (also called a read control circuit or a read driver) 150 performs various controls for a read operation (data read). The read circuit 150 supplies a read pulse (for example, a read current) to the memory cell array 100 when performing a read operation. The read circuit 150 senses a signal that is output from the memory cell MC. The data is read from the memory cell array 100 (selected memory cell MC) based on this sensing result.

For example, the read circuit 150 is coupled to the memory cell array 100 via the column control circuit 120. The read circuit 150 includes a voltage source and/or a current source, a pulse generation circuit, a latch circuit, a sense amplifier circuit, and so on.

The shift circuit (also called a "shift control circuit" or a "shift driver") performs various controls for a shift operation (data shifting). In a shift operation, the shift circuit 160 supplies, to the memory cell array 100, a current pulse (or a voltage pulse) for moving a domain wall (magnetic domain) in the magnet 5. Hereinafter, a pulse supplied to the magnet 5 for moving a domain wall is called a "shift pulse".

For example, the shift circuit 160 is coupled to the memory cell array 100 via the row control circuit 110 and/or the column control circuit 120. The shift circuit 160 includes a voltage source and/or a current source, a pulse generation circuit, and so on.

The write circuit 140, the read circuit 150, and the shift circuit 160 are not limited to circuits that are mutually independent. For example, the write circuit 140, the read circuit 150, and the shift circuit 160 may be provided in the magnetic memory 1 as a single integrated circuit having sharable constituent elements.

The input/output circuit (I/O circuit) 170 is an interface circuit for passing various types of signals. In a write operation, the I/O circuit 170 passes data DT from an external device (for example, a processor, a controller, or a host device) 2 to the write circuit 140 as write data. In a read operation, the I/O circuit 170 passes, to the external device 2, data that has been output from the memory cell array 100 to the read circuit 150 as read data. The I/O circuit 170 passes an address ADR and a command CMD from the external device 2 to the sequencer 190. The I/O circuit 170 passes various types of control signals CNT to and from the sequencer 190 and the external device 2.

The voltage generation circuit 180 generates voltages for various operations of the memory cell array 100, using a power supply voltage VDD and a ground voltage VGND provided from the external device 2 (or power source). For example, in a write operation, the voltage generation circuit 180 outputs various voltages generated for a write operation to the write circuit 140. In a read operation, the voltage generation circuit 180 outputs various voltages generated for a read operation to the read circuit 150. In a shift operation, the voltage generation circuit 180 outputs various types of voltages generated for a shift operation to the shift circuit 160.

The sequencer (also called "state machine", "internal controller", or "control circuit") 190 controls an operation of each circuit in the magnetic memory 1 based on the control signals CNT, the address ADR, and the command CMD. The sequencer 190 includes a command decoder, an address decoder, and a latch circuit, for example.

For example, the command CMD is a signal indicating an operation that the magnetic memory 1 should perform. For example, the address ADR is a signal indicating a coordinate of one or more operation-targeted memory cells (hereinafter, a "selected cell(s)") in the memory cell array 100. The address ADR includes a row address and a column address of the selected cell. For example, the control signal CNT is a signal for controlling timing of an operation between the magnetic memory 1 and the external device 2 and timing of an internal operation of the magnetic memory 1.

<Memory Cell Array>

An exemplary configuration of the memory cell array of the magnetic memory 1 of the present embodiment is described with reference to FIGS. 2 to 4.

FIG. 2 is a schematic diagram showing an exemplary configuration of the memory cell array 100 in the magnetic memory 1 according to the present embodiment.

As shown in FIG. 2, in the magnetic memory 1 of the present embodiment, a plurality of memory cell units UT are provided in the memory cell array 100.

The plurality of memory cell units UT are arranged on a substrate (not shown) in a two-dimensional manner (in an X direction and a Y direction). Each memory cell unit UT includes the magnet 5. The magnet 5 extends in a direction perpendicular to the upper surface (X-Y plane) of the substrate (namely, a Z direction). For example, the magnet 5 may be called a magnetic wire.

An X direction and a Y direction are directions parallel to the upper surface of the substrate. The Y direction intersects with the X direction. The Z direction intersects with (is perpendicular to) a plane extending in the X direction and the Y direction.

A plurality of source lines SL and a plurality of bit lines BL are provided in the memory cell array 100. A plurality of bit lines BL are provided above a plurality of source lines SL with respect to the Z direction. A plurality of bit lines BL may be provided below the plurality of source lines SL with respect to the Z direction. The plurality of source lines SL are arranged in the Y direction within the X-Y plane. Each source line SL extends in the X direction. The plurality of bit lines BL are arranged within the X-Y plane in a diagonal manner with respect to the X direction and the Y direction. The bit lines BL extend in a diagonal direction with respect to the X direction and the Y direction.

The plurality of bit lines BL may be arranged in the X direction within the X-Y plane. In this case, each bit line BL may extend in the Y direction.

Each memory cell unit UT is provided between a single source line SL and a single bit line BL. One end of the memory cell unit UT is coupled to the bit line BL. The other end of the memory cell unit UT is coupled to the source line SL.

A plurality of memory cell units UT arranged along the X direction are coupled to a source line SL in common. The plurality of memory cell units UT arranged in the X direction (the memory cell units UT coupled to the same source line SL) are coupled to different bit lines BL. The memory cell units UT coupled to the same bit line BL are arranged in a diagonal direction with respect to the X direction and the Y direction.

The field lines FL are provided above the substrate in the Z direction. The field lines FL extend in the X direction, for example. A single field line FL is adjacent to the plurality of memory cell units UT arranged in the X direction with respect to the Y direction.

The field lines FL are interconnects for a data write using a magnetic-field write method when the write operation is performed in the magnetic memory 1 (hereinafter, may be called a "write interconnect"). In the write operation using a magnetic field write method, a write pulse (e.g., a write current) is supplied to the field line FL. A magnetic field is caused around the field line FL by the write current. The generated magnetic field is applied to the magnet 5 of the memory cell unit UT. The direction of the magnetization MM of a portion in the magnet 5 to which the magnetic field is applied is set in accordance with the direction of the generated magnetic field. Data is thereby written in the magnet 5.

The direction of the magnetic field changes in accordance with the direction in which a write current flows in the field line FL. For this reason, the direction of a write current flow in the field line FL is set in accordance with data slated to be written.

In each memory cell unit UT, a plurality of memory cells MC are provided in each magnet 5. The plurality of memory cells MC are arranged in the Z direction in the magnet 5. Thus, the plurality of the memory cells MC are three-dimensionally arranged in the memory cell array 100.

Each of the memory cells MC includes a cell area (also called a "cell portion" or a "data retaining portion") 500 in the magnet 5. The cell area 500 is an area (portion) provided in the magnet 5 so as to correspond to the memory cell MC. The cell area 500 is a magnetic area (magnetic portion, magnetic layer) capable of having magnetization MM.

If the memory cell MC retains data, the cell area 500 has magnetization MM. Data stored in the memory cell MC is associated with the direction of the magnetization MM of the cell area 500.

The magnet 5 has perpendicular magnetic anisotropy or in-plane magnetic anisotropy. The direction of the easy magnetization axis of the cell area 500 changes in accordance with the magnetic anisotropy of the magnet 5.

The memory cell unit UT includes a read element (not shown) and a selector (not shown) in addition to the plurality of memory cells MC. The structures of the read element and the selector will be described later.

For example, the source lines SL and the field lines FL are controlled by the row control circuit 110. For example, the bit lines BL are controlled by the column control circuit 120.

The write circuit 140 supplies a current (or a voltage) to the field lines FL.

The read circuit 150 can detect a potential or a current in the bit line BL.

A configuration of the memory cell unit UT in the magnetic memory 1 according to the present embodiment is described with reference to FIGS. 3 and 4.

FIG. 3 is an overhead view showing an exemplary configuration of the memory cell unit UT in the magnetic memory 1 according to the present embodiment. FIG. 4 is a sectional view showing an exemplary configuration of the memory cell unit UT in the magnetic memory 1 according to the present embodiment.

Figure 4:
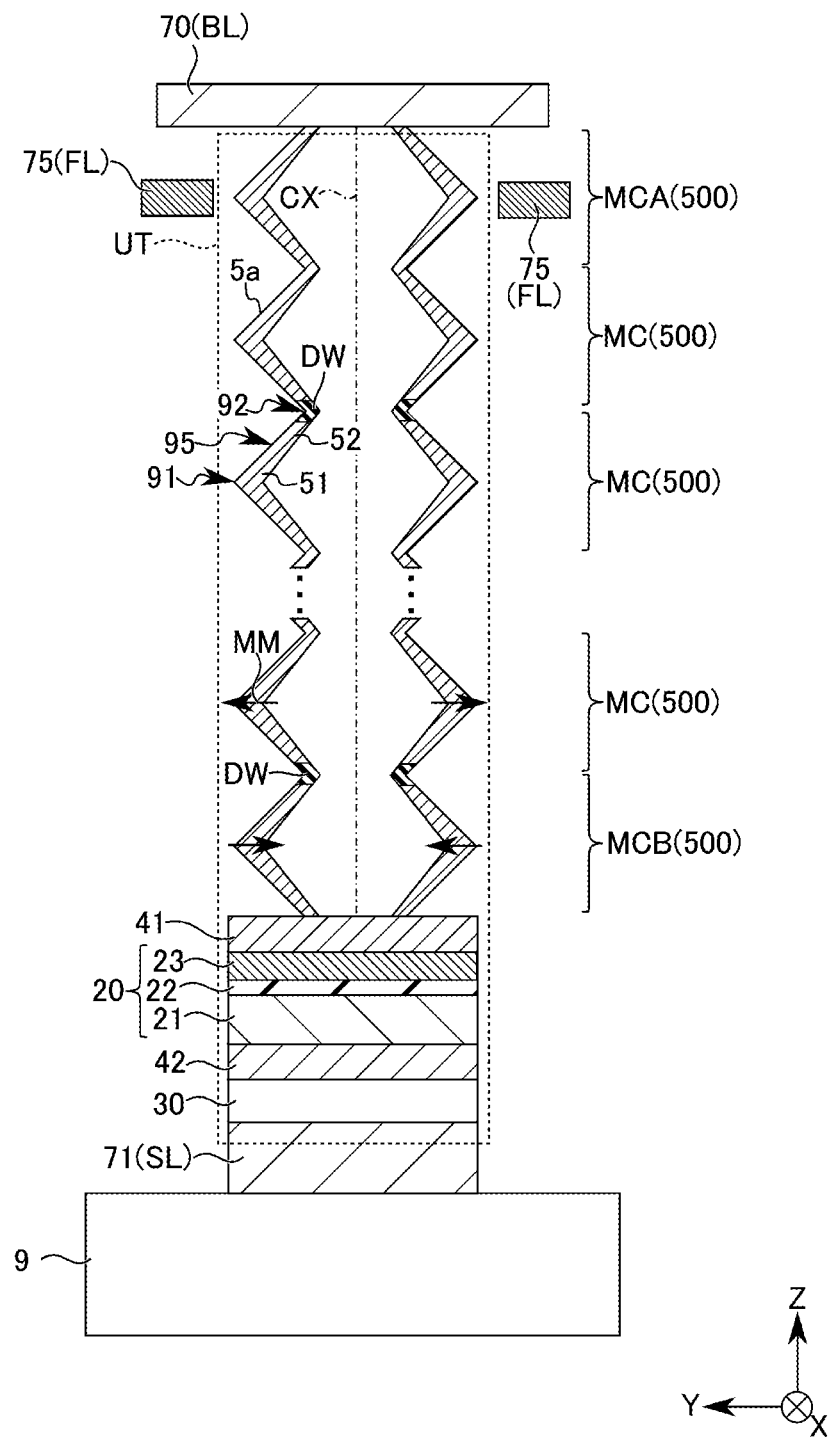
FIG. 4 is a sectional view showing an exemplary configuration of the memory cell unit in the magnetic memory according to the first embodiment.

As shown in FIGS. 3 and 4, in the memory cell unit UT, the magnet 5a is provided above the substrate 9 in the Z direction. The magnet 5a extends in the Z direction.

One end (the upper end) of the magnet 5a in the Z direction is coupled to a conductive layer 70. The conductive layer 70 functions as the bit line BL.

The other end (the lower end) of the magnet 5a in the Z direction is coupled to a conductive layer 71, with a read element 20 and a selector 30 being interposed therebetween. The conductive layer 71 functions as the source line SL. One end of the magnet 5a in the Z direction may be coupled to the conductive layer 70, with a read element 20 and a selector 30 being interposed therebetween. In this case, the field line FL may be provided on the other end side of the magnet 5a in the Z direction.

For example, the magnet 5a is a tubular (cylindrical) magnetic layer (hereinafter, may be referred to as "a domain-wall motion layer"). The center axis CX of the tubular magnet 5a extends in the Z direction. The central axis CX of the magnet 5a may be tilted with respect to the Z direction.

The magnet 5a is covered by an insulator (not shown). The inside of the cylinder of the magnet 5a may be a void, without being embedded by the insulator.

For example, the material of the magnet 5a is a material containing at least one element selected from the group consisting of cobalt (Co), iron (Fe), nickel (Ni), manganese (Mn), and chrome (Cr), and at least one element selected from the group consisting of platinum (Pt), palladium (Pd), iridium (Ir), ruthenium (Ru), and rhodium (Rh). More specific examples of the material of the magnet 5a are for example, CoPt, CoCrPt, FePt, CoPd, or FePd. The materials of the magnet 5a are not limited to the above-listed materials and other magnetic materials may be used.

The magnet 5a may be a single-layer magnetic film. The magnet 5a may include a plurality of films stacked in the parallel direction to the surface of the substrate 9. For example, the magnet 5a may have a structure including a magnetic film and a non-magnetic film (for example, a hafnium oxide film).

For example, if the magnet 5a has perpendicular magnetic anisotropy, the direction of the magnetization MM is in the direction parallel to the upper surface of the substrate 9. In the magnet 5a of the perpendicular magnetic anisotropy, the magnetization MM of the magnet 5a is directed in the direction from the center of the magnet 5a toward the outer periphery of the magnet 5a, or the direction from the outer periphery toward the center of the magnet 5.

The magnet 5a includes memory cells MC, MCA, MCB. The memory cells MC, MCA, MCB are arranged in the Z direction in the magnet 5a.

The cell area 500 corresponding to each memory cell MC is provided in the magnet 5a. A single memory cell MC is provided in a single cell area 500.

Among the memory cells MC, MCA, and MCB in the magnet 5a, the uppermost memory cell MCA is adjacent to a conductive layer 75 in the direction parallel to the surface of the substrate 9. The conductive layer 75 functions as the field line FL.

In a write operation, the magnetic field caused by the field line FL is applied to the memory cell MCA. The magnetization direction of the memory cell MCA is controlled by the applied magnetic field. In the example shown in FIGS. 3 and 4, the memory cell MCA functions as a write cell during a write operation. The write cell MCA is a memory cell to which write data is temporarily written during a write operation.

Among the memory cells MC, MCA, and MCB in the magnet 5a, the lowermost memory cell MCB is adjacent to the read element 20, with a conductive layer 41 being interposed therebetween.

The magnetization of the memory cells MCB (for example, a stray field) affects the read element 20. In the example shown in FIGS. 3 and 4, the memory cell MCB functions as a read cell during a read operation. The read cell is a memory cell that temporarily retains data from a memory cell targeted for a read operation during a read operation.

The read element (regeneration element) 20 is provided between the magnet 5a and the selector 30. The read element 20 is electrically coupled to the magnet 5a and the selector 30. For example, the read element 20 is coupled to the magnet 5a via the conductive layer 41. The read element 20 may be in direct contact with the magnet 5a (memory cell MCB), without the conductive layer 41 being interposed therebetween.

The read element 20 can detect data in the read cell MCB in the magnet 5a during a read operation in the magnetic memory 1.

The read element 20 is a magnetoresistive effect element 20, for example.

The magnetoresistive effect element 20 is arranged at a position where the element 20 overlaps the magnet 5 with respect to the Z direction. The magnetoresistive effect element 20 may be arranged at a position where the element 20 does not overlap the magnet 5a with respect to the Z direction, as long as the element 20 is magnetically coupled to the memory cell MCB.

For example, the magnetoresistive effect element 20 includes two magnetic layers 21 and 23, and a non-magnetic layer 22. The non-magnetic layer 22 is arranged between the two magnetic layers 21 and 23 in the Z direction. The two magnetic layers 21 and 23 and the non-magnetic layer 22 form a magnetic tunnel junction (MTJ). Hereinafter, the magnetoresistive effect element 20 including this MTJ will also be called an "MTJ element". The non-magnetic layer 22 of the MTJ element 20 will also be called a "tunnel barrier layer".

The magnetic layer 23 is arranged above the magnetic layer 21 in the Z direction, with the tunnel barrier layer 22 being interposed therebetween. The magnetic layer 23 is provided between the tunnel barrier layer 22 and the conductive layer 41. The magnetic layer 21 is provided between the tunnel barrier layer 22 and the conductive layer 42.

The magnetic layers 21 and 23 are a ferromagnetic layer containing, for example, cobalt, iron, and/or boron, etc. The magnetic layers 21 and 23 may each be a mono-layer film or a multi-layer film (e.g., an artificial lattice film). The tunnel barrier layer 22 is an insulation film containing magnesium oxide, for example. The tunnel barrier layer may be a mono-layer film or a multi-layer film.

The magnetic layers 21 and 23 each have in-plane magnetic anisotropy or perpendicular magnetic anisotropy.

For example, if the magnetic layers 21 and 23 have perpendicular magnetic anisotropy, the direction of the easy magnetization axis of the magnetic layers 21 and 23 having perpendicular magnetic anisotropy is substantially perpendicular to the layer surface (film surface) of the magnetic layer. In this case, the magnetic layers 21 and 23 each have a magnetization substantially perpendicular to the layer faces of the magnetic layers 21 and 23. The magnetization direction of each of the magnetic layers 21 and 23 is parallel to the direction (Z direction) in which the magnetic layers 21 and 23 are arranged.

For example, if the magnetic layers 21 and 23 have in-plane magnetic anisotropy, the direction of the easy magnetization axis of the magnetic layers 21 and 23 having in-plane magnetic anisotropy is substantially parallel to the layer face (film face) of the magnetic layer. In this case, the magnetic layers 21 and 23 each have a magnetization substantially parallel to the layer faces of the magnetic layers 21 and 23. The magnetization direction of each of the magnetic layers 21 and 23 is perpendicular to the direction (Z direction) in which the magnetic layers 21 and 23 are arranged.

The magnetization direction of the magnetic layer 21 is invariable (in a fixed state). The magnetization direction of the magnetic layer 23 is variable.

The magnetic layer 21 having an invariable (fixed) magnetization direction will be called a "reference layer". Hereinafter, the magnetic layer 23 having a variable magnetization direction will be called a "storage layer". There are other terms for the reference layer 21, such as a "pin layer", a "pinned layer", an "invariable magnetization layer", and a "fixed magnetization layer". There are other terms for the storage layer 23, such as a "free layer", a "free magnetization layer", and a "variable magnetization layer".

The magnetization direction of the storage layer 23 varies in accordance with the magnetization direction of the memory cell MCB. For example, the magnetization direction of the storage layer 23 changes in accordance with the stray field of the magnetization MM of the memory cell MCB. As a result, the magnetization direction of the storage layer 23 conforms to the magnetization direction of the memory cell MCB.

In the context of this embodiment, an invariable or a fixed-state magnetization direction of the reference layer (one magnetic layer) means that a current, a voltage, or magnetic energy (e.g., magnetic field) supplied to the MTJ element 20 for changing the magnetization direction of the storage layer does not entail a change in the magnetization direction of the reference layer before and after the supply of the current, the voltage, or the magnetic energy.

The selector (may be called "switching element) 30 is provided between the MTJ element 20 and the source line SL. The selector 30 is electrically coupled to the MTJ element 20 with the conductive layer 42 being interposed therebetween. The selector 30 is in direct contact with the source line SL. A conductor (not shown) may be provided between the selector 30 and the source line SL.

The selector 30 includes, for example, a semiconductor layer, a compound layer (e.g., a transition metal oxide layer or a chalcogenide compound layer), or an insulating layer.

The selector 30 is used for controlling a coupling and a non-coupling between the magnet 5a (memory cell unit UT) and the source line SL.

If the selector 30 is set to an on state (conductive state), the magnet 5a is electrically coupled to the source line SL. If the selector 30 is set to an off state (non-conductive state), the magnet 5a is electrically decoupled from the source line SL.

For example, the on/off state of the selector 30 is controlled in accordance with a potential difference between the bit line BL and the source line SL.

The selector 30 in an on state electrically couples the memory cell unit UT to the source line SL. The selector 30 in an off state electrically decouples the memory cell unit UT from the source line SL.

With the control of the on/off state of the selector 30, one or more memory cell unit UT targeted for operation in a plurality of memory cell units UT in the memory cell array 100 can be selected (activated). A current can flow in a selected memory cell unit UT.

Preferably, the selector 30 is capable of causing a current to flow in the memory cell unit UT bidirectionally. A transistor may be used as the selector 30. For example, a vertical transistor may be used as a transistor serving as the selector. In the vertical transistor, a channel extends in the Z direction. Within the X-Y plane, the channel is encompassed by a gate electrode. The interconnects coupled to the gate electrode extend in the direction intersecting the direction in which the bit line BL extends. In this case, the source line SL may be coupled to each magnet 5a in common as a common electrode. The source line SL may be an electrode having a plate-like shape.

For example, a magnetic memory having the memory cell unit UT shown in FIGS. 3 and 4 functions as a domain-wall motion memory (e.g., a shift register) in an FIFO (first-in first-out) method.

As shown in FIGS. 3 and 4, in the magnetic memory 1 of the present embodiment, the tubular magnet 5a has constrictions. In the magnet 5a having constrictions, the dimensions of the magnet 5a in the direction parallel to the upper surface of the substrate 9 (X direction or Y direction) (for example, a diameter of the tubular magnetic layer) changes in a periodic manner in the Z direction. The magnet 5a is constricted at predetermined intervals (in a periodic manner) in the Z direction.

The magnet 5a having constrictions has maximum points 91 at which the dimension of the magnet 5a in the direction parallel to the upper surface of the substrate 9 becomes larger (for example, largest) and minimum points 92 at which the dimension of the magnet 5a in the direction parallel to the upper surface of the substrate 9 becomes smaller (for example, smallest). The maximum points (also called "maximum portions") 91 and the minimum points (also called "minimum portions") 92 are arranged alternately in the magnet 5a in the Z direction.

As shown in (a) of FIG. 5, which is explained later, at the maximum point 91, the magnet 5a has a dimension D1 in the direction parallel to the upper surface of the substrate 9 (for example, at least one of the X direction or the Y direction). For example, the dimension D1 is a largest dimension of the magnet 5a in the X direction (or the Y direction) (i.e., a largest diameter). The dimension D1 corresponds to the outer diameter of the magnet 5a at the maximum point 91.

At the minimum point 92, the magnet 5a has a dimension D2 in the direction parallel to the upper surface of the substrate 9 (for example, at least one of the X direction or the Y direction). The dimension D2 is smaller than the dimension D1. For example, the dimension D2 is a smallest dimension of the magnet 5a in the X direction (or the Y direction) (i.e., a smallest diameter). The dimension D2 corresponds to the outer diameter of the magnet 5a at the minimum point 92.

The halfway position between the maximum point 91 and the minimum point 92 in the magnet 5a may also be called a "halfway point" (or a "halfway portion" or a "boundary portion") 95.

Each memory cell MC includes a plurality of convex portions (or peaks) 51 and a plurality of concave portions (or valleys or tails) 52 in the corresponding cell area 500. The convex portions 51 and the concave portions 52 constitute a single continuous layer in the magnet 5a. In the magnet 5a, convex portions 51 and concave portions 52 are alternately arranged in the Z direction.

One memory cell MC includes one convex portion 51 and two concave portions 52. One convex portion 51 is provided between two concave portions 52 in the Z direction.

The convex portion 51 corresponds to a portion (area) between two halfway points 95, with the maximum point 91 being located therebetween. The convex portion 51 includes the maximum point 91. The convex portion 51 includes the dimension D1.

As shown in (b) of FIG. 5, which is described later, the cross-sectional area of the convex portion 51 (magnet 5a) viewed in the Z direction is maximum at the position at which the magnet 5a has the dimension D1 (the position of the maximum point 91).

The concave portion 52 corresponds to a portion (area) between the halfway point 95 and the minimum point 92. The concave portion 52 includes the minimum point 92. The concave portion 52 includes the dimension D2.

As shown in (c) of FIG. 5, which is described later, the cross-sectional area of the concave portion 52 (magnet 5a) viewed in the Z direction is minimum at the position at which the magnet 5a has the dimension D2 (the position of the minimum point 92).

For example, the cross-sectional area of the magnet 5a at the halfway point 95 viewed in the Z direction is smaller than the cross-sectional area of the magnet 5a at the maximum point 91 viewed in the Z direction and larger than the cross-sectional area of the magnet 5a at the minimum point 92 viewed in the Z direction.

Regarding the dimension of the tubular magnet 5a in the X direction (or the Y direction) from the center axis CX to the inner end (inner wall) of the magnet 5a (namely, inner diameter), the inner diameter of the concave portion 52 is smaller than the inner diameter of the convex portion 51.

For example, the dimension (interval) between the top of the convex portion 51 and the bottom of the concave portion 52 in the X direction (or the Y direction) is defined as a depth of the constriction between the convex portion 51 and the concave portion 52. The top of the convex portion 51 is a part having the largest dimension D1 of the magnet 5a. The bottom of the concave portion 52 is a part having the smallest dimension D2 of the magnet 5a.

The minimum point 92 of the concave portion 52 is shared by two memory cells MC adjacent in the Z direction. The minimum point 92 is arranged at the boundary of the adjacent memory cells MC.

In the present embodiment, a domain wall DW is retained in the concave portion 52 in accordance with the magnetization state of the adjacent memory cells MC, MCA, and MCB (convex portions 51). The concave portion 52 may be called a domain-wall-retaining portion (or a domain-wall-present region) 52.

If two memory cells MC adjacent in the Z direction store data of different values ("0" or "1"), the magnetization direction (magnetization domain) of one of the memory cells MC differs from that of the other memory cell MC. In this case, the domain wall DW is formed in the boundary between the magnetic domain of one of the memory cells MC and the magnetic domain of the other memory cell MC.

For example, if two memory cells MC adjacent to each other in the Z direction store data of the same value, the magnetization directions of these memory cells MC are the same. In this case, a single magnetic domain spans two memory cells MC.

The domain wall DW has a certain width. The width of the domain wall DW is, for example, from a few nanometers to a few tens of nanometers.

The domain wall DW may be stable if it has a small volume. For this reason, the domain wall DW may be present in the concave portion 52 of the boundary of the adjacent memory cells MC. As a result, the concave portion 52 is used as a domain-wall-retaining portion in two memory cells MC sharing the minimum point 92.

The structure that includes at least one convex portion 51 constitutes an area of one cycle in the magnet 5a having a periodically constricted structure. This structure of one cycle is used as a single memory cell MC.

In the present embodiment, the dimensions of each of the portions 51 and 52 in the tubular magnet 5a are based on the outer peripheral surface (outer wall) of the magnet 5a as a reference. If the relationship between the dimensions of each of the portions 51 and 52 in the magnet 5a according to the present embodiment is satisfied, the dimensions of the portions 51 and 52 may be defined based on the inner peripheral surface (inner wall) of the magnet 5a as a reference.

The structures of the memory cells MC and the magnet 5a in the magnetic memory 1 according to the present embodiment are described in detail with reference to FIG. 5.

FIG. 5 is a schematic diagram for explaining an exemplary structure of the memory cell MC of the magnetic memory 1 according to the present embodiment. The diagram (a) of FIG. 5 is a sectional view showing an exemplary structure of the memory cell MC in the magnetic memory 1 according to the present embodiment. The diagram (b) of FIG. 5 shows the top view of the cross section of line B-B in (a) of FIG. 5, viewed in the Z direction. The diagram (c) of FIG. 5 shows the top view of the cross section of line C-C in (a) of FIG. 5, viewed in the Z direction.

As shown in (a) of FIG. 5, each memory cell MC includes one convex portion 51 and two concave portions 52 in the magnet 5a. The concave portion 52 is provided in the area adjacent to the convex portion 51 with respect to the Z direction. The concave portion 52 is present in the boundary between the memory cells MC.

In the present embodiment, the boundary between the convex portion 51 and the concave portion 52 in the magnet 5a is defined as a part having the dimension D3 between the dimension D1 and the dimension D2. For example, the dimension (outer diameter) D3 can be expressed as (D1+D2)/2. The halfway point 95 corresponds to the portion having the dimension D3.

For example, the halfway point 95 is provided on the position marking half the distance between the maximum point 91 and the minimum point 92 in the Z direction (the position marking a quarter of a cycle).

The memory cell MC has, for example, a dimension H1 in the Z direction. The dimension H1 corresponds to an interval between two concave portions 52 adjacent to each other in the Z direction. For example, the halfway point 95 is provided at the position marking a quarter of the dimension H1 from the concave portion 52 (minimum point 92) in the Z direction. The maximum point 91 is provided at the position marking a half of the dimension H1 from the concave portion 52 (minimum point 92) in the Z direction.

As shown in (b) and (c) of FIG. 5, each of the convex portion 51 and the concave portion 52 has an annular shape when viewed in the Z direction. Each of the convex portion 51 and the concave portion 52 may have an elliptical annular shape when viewed in the Z direction.

As described above, the dimension (outer diameter) D2 of the concave portion 52 at the minimum point 92 in the X direction (or the Y direction) is smaller than the dimension D1 of the convex portion 51 at the maximum point 91 in the X direction.

In the magnetic memory 1 of the present embodiment, the thickness (film thickness) of the convex portion 51 of the magnet 5a differs from the thickness of the concave portion 52 in the magnet 5a.

The convex portion 51 has a thickness t1 in the direction parallel to the X-Y plane (for example, the X direction or the Y direction). For example, the thickness t1 is a dimension of the convex portion 51 at the maximum point 91. The concave portion 52 has a thickness t2 in the direction parallel to the X-Y plane (for example, the X direction or the Y direction). The thickness t2 is smaller than the thickness t1. For example, the thickness t2 is a dimension of the concave portion 52 at the minimum point 92.

The thickness of the convex portion 51 gradually decreases from the maximum point 91 toward the halfway point 95.

The thickness of the concave portion 52 gradually decreases from the minimum point 92 toward the halfway point 95.

For example, in the inner diameter of the magnet 5a, the convex portion 51 includes a dimension D1a at the maximum point 91. The dimension D1a is smaller than the dimension D1 in accordance with the thickness t1. In the inner diameter of the magnet 5a, the concave portion 52 includes a dimension D2a at the minimum point 92. The dimension D2a is smaller than the dimension D2 in accordance with the thickness t2.

In the present embodiment, the cross-sectional area of the concave portion 52 in the X-Y plane (the cross-sectional area viewed in the Z direction) is smaller than that of the convex portion 51 in the X-Y plane (the cross-sectional area viewed in the Z direction) in accordance with the difference between the thicknesses t1 and t2 of the portions 51 and 52, in addition to the differences between the outer diameters D1 and D2 of the portions 51 and 52.

For this reason, the volume of the concave portion 52 of the magnet 5a at the minimum point 92 (which is obtained by integrating the cross-sectional area of the concave portion 52 in the X-Y direction with respect to the width of the Z direction of the domain wall) is much smaller than the volume of the convex portion 51 of the magnet 5a at the maximum point 91 (which is obtained by integrating the cross-sectional area of the convex portion 51 in the X-Y direction with respect to the width of the Z direction of the domain wall), depending on the difference in the thickness between the portions 51 and 52.

In the magnetic memory 1 of the present embodiment, the shifting of data in the memory cell unit UT is performed by a shift operation performed on the domain wall DW in the magnet 5a.

As described later, in the magnetic memory 1 of the present embodiment, the domain wall DW retained in a certain memory cell MC is moved (shifted) to other memory cell MC by a shift pulse (for example, a current pulse) supplied to the magnet 5a. In one example of the operation sequence in the magnetic memory 1, the domain wall DW is shifted by one cycle (one memory cell MC) at a single supply of a shift pulse. Along with the shifting of the domain wall DW between the memory cells MC, the magnetization domain (magnetization) in the memory cell MC moves.

For example, the domain wall DW is present in the concave portion (domain-wall-retaining portion) 52 on one end of a memory cell MC. This domain wall DW is moved by a shift pulse, via the convex portion 51, to the concave portion 52 on the other end side of the memory cell MC (the domain-wall-retaining portion of a memory cell adjacent to the memory cell). There may be a case where the domain wall DW is arranged in the convex portion 51 as a temporary state during a shift operation (data shifting).

The volume of the concave portion 52 having the outer diameter D2 and the thickness t2 (for example, the volume of the magnet 5a at the minimum point 92) is smaller than the volume of the convex portion 51 having the outer diameter D1 and the thickness t1 (for example, the volume of the magnet 5a at the maximum point 91).

For this reason, the domain wall DW may be stably present in the concave portion 52.

Thus, the magnetic memory 1 of the present embodiment can suppress excessive moving of a domain wall between memory cells. Therefore, the magnetic memory 1 of the present embodiment can reduce a deviation between a position of a moved domain wall DW and a target position.

As described later, the magnetic memory 1 of the present embodiment can increase the volume change ratio of the domain wall in the convex portion 51 by changing the thickness of the magnet 5a from the minimum point 92 to the maximum point 91.

As a result, smooth moving of the domain wall DW in the vicinity of the maximum point 91 can be achieved in the magnetic memory 1 of the present embodiment.

It is therefore possible to suppress erroneous shifting of the domain wall in the magnetic memory 1 of the present embodiment.

The convex portion 51 has a symmetric shape about the maximum point 91 with respect to the moving direction of the domain wall DW. For this reason, in the present embodiment, it can be possible to suppress variation in the amount the domain wall DW has moved due to the asymmetricity of the shape of the convex portion 51 (cell area 500) in the case where the domain wall DW moves from one end side of the magnet 5a to the other end side and vice versa in response to a supplied predetermined shift pulse.

(b) Characteristics

Characteristics of the magnetic memory 1 of the present embodiment are described with reference to FIGS. 6 to 9.

Figure 6:
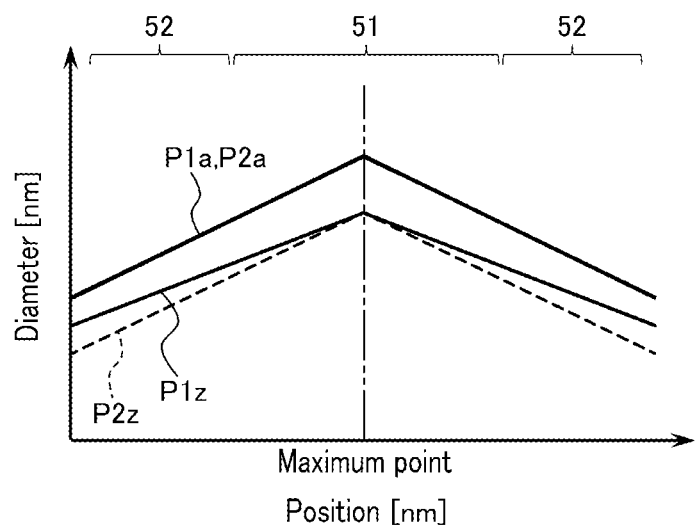
FIG. 6 is a diagram showing characteristics of the magnetic memory according to the first embodiment.

FIG. 6 is a graph indicating changes of the outer diameter and the inner diameter of the magnet in the magnetic memory 1 of the present embodiment. In the graph of FIG. 6, the vertical axis corresponds to the dimension of the magnet in the direction parallel to the upper surface of the substrate, and the horizontal axis corresponds to the position in the magnet in the direction in which the magnet extends (the moving direction of the domain wall).

In FIG. 6, the characteristics P1a and P1z indicated by solid lines indicate characteristics of the magnetic memory 1 of the present embodiment. The characteristics P2a and P2z indicated by broken lines indicate characteristic of a magnetic memory (hereinafter, the magnetic memory of a comparative example) in which the thickness of the magnet is constant from the convex portion (maximum point) to the concave portion (minimum point). The characteristics P1a and P2a correspond to the outer diameter of the magnet. The characteristics P1z and P2z correspond to the inner diameter of the magnet.

As shown in FIG. 6, the outer diameter and the inner diameter of the magnet 5a change in a linear manner between the maximum point 91 and the minimum point 92.

In the present embodiment, the thickness of the magnet 5a gradually decreases from the maximum point 91 toward the minimum point 92. As described above, the thickness t1 of the magnet 5a at the maximum point 91 is thicker than the thickness t2 of the magnet 5a at the minimum point 92.

For example, the inner-wall side of the magnet 5a is trimmed. In this case, the amount of change (gradient) of the inner diameter of the magnet 5a from the maximum point 91 to the minimum point 92 is smaller than that of the outer diameter of the magnet 5a from the maximum point 91 to the minimum point 92.

The dimensional ratio of the inner diameters at the maximum point 91 and the minimum point 92 (D1a/D2a) differs from the dimensional ratio of the outer diameters at the maximum point 91 and the minimum point 92 (D1/D2). As a result, the change rate of the inner diameter of the magnet 5a differs from the change rate of the outer diameter of the magnet 5a.

For example, the change rate of the diameter of the magnet 5a on the convex portion 51 side is larger than that on the concave portion 52 side.

Figure 7:
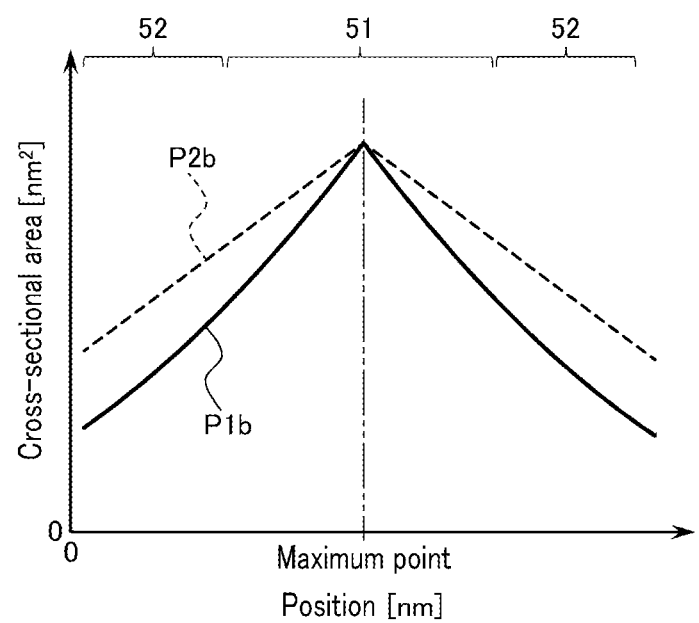
FIG. 7 is a diagram showing characteristics of the magnetic memory according to the first embodiment.

FIG. 7 is a graph indicating changes of the cross-sectional area of the magnet (domain wall) viewed in the Z direction in the magnetic memory 1 of the present embodiment. In the graph of FIG. 7, the vertical axis corresponds to the cross-sectional area, and the horizontal axis corresponds to the center position of the domain wall with respect to the extending direction of the magnet (the moving direction of the domain wall).

In FIG. 7, the characteristic P1b indicated by the solid line shows the characteristic of the magnetic memory 1 of the present embodiment. The characteristic P2b indicated by the broken line, on the other hand, shows the characteristic of the magnetic memory 1 of the comparative example.

As shown in FIG. 7, if the thickness of the magnet is constant as shown in the characteristics P2b of the magnetic memory of the comparative example, the cross-sectional area of the magnet viewed in the Z direction linearly decreases from the maximum point 91 to the minimum point 92.

In contrast, in the present embodiment, if the thickness of the magnet 5a gradually decreases from the top of the convex portion 51 (maximum point 91) toward the bottom of the concave portion 52 (minimum point 92) as shown by the characteristic P1b, the cross-sectional area of the magnet 5a (domain wall) viewed in the Z direction non-linearly decreases from the maximum point 91 to the minimum point 92.

Herein, regarding the change rate of the cross-sectional area of the magnet 5a, the change rate of the cross-sectional area on the convex portion 51 side is larger than the change rate of the cross-sectional area on the concave portion 52 side.

Figure 8:
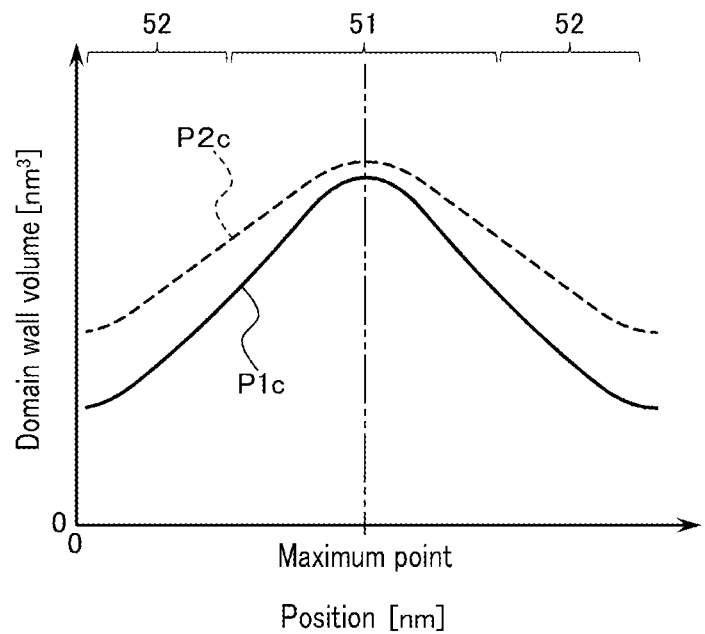
FIG. 8 is a diagram showing characteristics of the magnetic memory according to the first embodiment.

FIG. 8 is a graph indicating changes in the volume of the domain wall in the magnet in the magnetic memory 1 of the present embodiment. In the graph of FIG. 8, the vertical axis corresponds to the volume of the domain wall, and the horizontal axis corresponds to the center position of the domain wall in the extending direction of the magnet (the moving direction of the domain wall).

In FIG. 8, the characteristic P1c indicated by the solid line shows the characteristic of the magnetic memory 1 of the present embodiment. The characteristic P2c indicated by the broken line, on the other hand, shows the characteristic of the magnetic memory 1 of the comparative example.

If the thickness of the magnet 5a decreases from the convex portion 51 toward the concave portion 52 in the magnetic memory 1 of the present embodiment, the volume change ratio of the domain wall DW will be large compared to the characteristics P2c, as shown by the characteristic P1c.

For example, in the vicinity of the top (maximum point 91) of the convex portion 51, the volume change ratio of the domain wall DW is gradual because the domain wall DW has a certain width.

Figure 9:
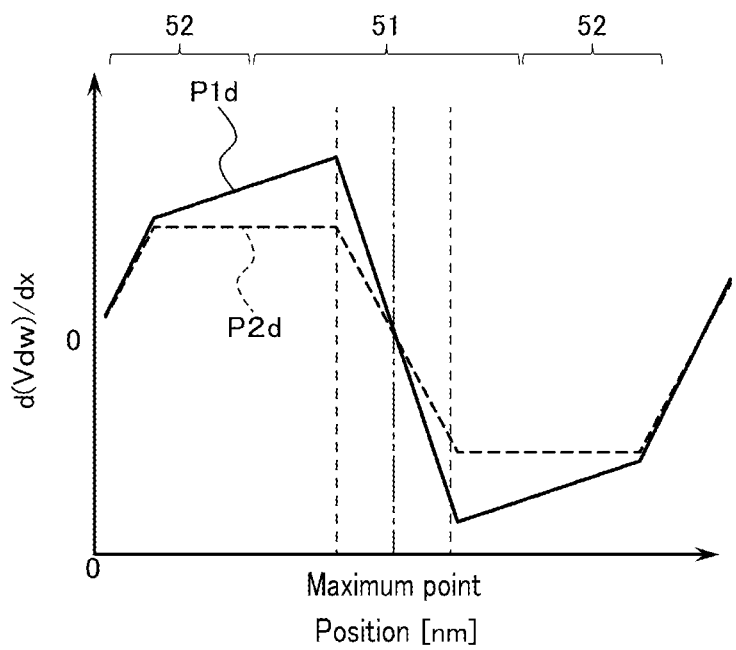
FIG. 9 is a diagram showing characteristics of the magnetic memory according to the first embodiment.

FIG. 9 is a graph indicating a transition of the volume change ratio of the domain wall in the magnetic memory of the present embodiment. In the graph of FIG. 9, the vertical axis corresponds to the volume change ratio of the domain wall, and the horizontal axis corresponds to the center position of the domain wall in the extending direction of the magnet (the moving direction of the domain wall). For example, the volume change ratio of the domain wall is indicated by differentiation of the volume of the domain wall (Vdw) with respect to the center position (x) of the domain wall. In FIG. 9, the characteristic P1d indicated by the solid line shows the characteristic of the magnetic memory 1 of the present embodiment. The characteristic P2d indicated by the broken line, on the other hand, shows the characteristic of the magnetic memory of the comparative example.

As shown in FIG. 9, if the domain wall DW is located at the minimum point 92 of the concave portion 52 on one side of the memory cell MC, the volume change ratio of the domain wall DW is zero.

As indicated by the characteristics P1d, the volume change ratio of the domain wall DW tends to increase as the domain wall DW moves from the concave portion 52 toward the convex portion 51, in accordance with the change of the thickness and the outer diameter of the magnet 5a.

When the domain wall DW is moved to the vicinity of the top (maximum point 91) of the convex portion 51, the volume change ratio of the domain wall DW transitions from the increase to the decrease. When the domain wall DW reaches the top of the convex portion 51, the volume change ratio of the domain wall DW becomes zero.

As the domain wall DW is moved from the convex portion 51 toward the concave portion 52 on the other end side of the memory cell MC, the absolute value of the volume change ratio of the domain wall DW increases.

When the domain wall DW reaches the minimum point 92 of the concave portion 52, the volume change ratio of the domain wall DW becomes zero.

The volume change ratio of zero means that it is difficult to move the domain wall DW. As the absolute value of the volume ratio change becomes larger than zero, it becomes easier to move the domain wall DW. For this reason, in the area where the absolute value of the volume change ratio of the domain wall DW is large, the domain wall DW can be relatively easily moved within the magnet 5a.

For this reason, if the absolute value of the volume change ratio of the domain wall DW is large in the vicinity of the convex portion 51 as in the present embodiment, the domain wall DW can be easily moved in the vicinity of the convex portion 51.

As a result, the magnetic memory 1 of the present embodiment can suppress errors in shifting of the domain wall DW.

(c) Operation Example

An operation example of the magnetic memory 1 according to the present embodiment is described with reference to FIG. 10.

<Write Operation>

A write operation in the magnetic memory according to the present embodiment is described.

In a write operation, the magnetic memory 1 of the present embodiment receives a write command, a write address, and data slated to be written in a memory cell (write data) from the external device 2.

The sequencer 190 controls an operation of each circuit in the magnetic memory 1 in accordance with a write command.

The row control circuit 110 and the column control circuit 120 select a memory cell unit UT in the memory cell array 100 in accordance with a write address.

In a data write operation, the write circuit 140 causes a write current to flow a field line FL. The direction in which a write current flows is set in accordance with write data. For example, a single memory cell unit UT is interposed between two field lines FL in the Y direction. In this case, the write circuit 140 causes opposite write currents in the two field lines FL between which the memory cell unit UT (memory cell MCA) is interposed, respectively.

Upon supply of the write current, a magnetic field is generated from the field line FL. The direction of the magnetic field is in accordance with the direction in which the write current flows.

The generated magnetic field is applied to the memory cell MCA in the magnet 5a. The magnetization direction of the memory cell MCA is set in accordance with the applied magnetic field.

The write data is thus written in a memory cell MCA. For example, when the data in the memory cell MCA differs from the data in the memory cell MC adjacent to the memory cell MCA in the memory cell unit UT, the domain wall DW is generated in the concave portion 52 that serves as a boundary between the memory cell MCA and the memory cell MC.

By a shift operation, which is described later, the data written in the memory cell MCA is transferred to a predetermined memory cell MC in the memory cell unit UT.

Through the above operation, the write operation of the magnetic memory 1 of the present embodiment is completed.

<Read Operation>

A read operation in the magnetic memory according to the present embodiment is described.

In a read operation, the magnetic memory 1 of the present embodiment receives a read command and a read address from the external device 2.

The sequencer 190 controls an operation of each circuit in the magnetic memory 1 in accordance with a read command.

The row control circuit 110 and the column control circuit 120 select a memory cell unit UT in the memory cell array 100 in accordance with a read address. In the selected memory cell unit UT, the selector 30 is set to an on state.

By a shift operation, which is described later, the data written in the memory cell MC corresponding to the read address is transferred to the memory cell MCB.

The magnetization direction of the memory cell MCB is responsive to data that has been transferred to the memory cell MCB. The magnetization direction of the storage layer 23 of the MTJ element 20 is set according to a magnetic field (stray field) stemming from the magnetization of the memory cell MCB.

As a result, the magnetization direction of the storage layer 23 corresponds to data targeted to be read.

In a data read operation, the read circuit 150 causes a read current to flow between the magnet 5a and the MTJ element 20. A current value of the read current has a magnitude that does not cause moving of the domain wall DW.

The read circuit 150 senses a signal in accordance with a current (or a voltage) that is output from the MTJ element 20.

The magnitude of a current that is output from the MTJ element 20 changes in accordance with the magnetization array between the reference layer 21 and the storage layer 23.

For example, a current value of a current when the magnetization array between the reference layer 21 and the storage layer 23 is in a parallel (P) state is larger than a current value of a current when the magnetization array between the reference layer 21 and the storage layer 23 is in an anti-parallel (AP) state.

The read circuit 150 determines data transferred from the memory cell MC corresponding to the read address to the memory cell MCB, based on a result of sensing the current.

The read circuit 150 sends the data obtained by the sensing result to the I/O circuit 170. The I/O circuit 170 sends data from the read circuit 150 as read data DT to the external device 2.

Through the above operation, the read operation of the magnetic memory 1 of the present embodiment is completed.

<Shift Operation>

Figure 10:
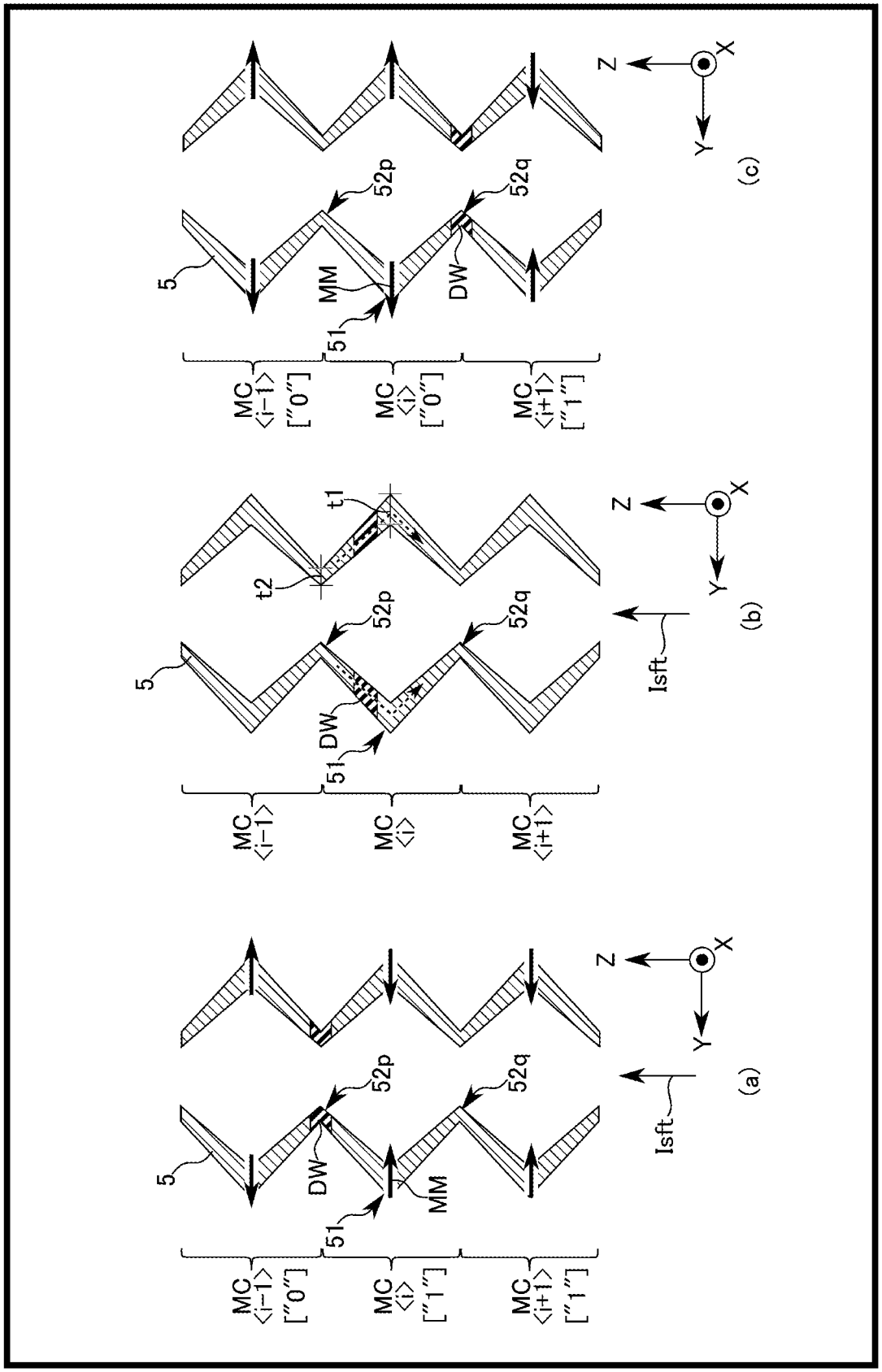
FIG. 10 is a diagram showing an exemplary operation of the magnetic memory according to the first embodiment.

FIG. 10 is a schematic diagram for explaining a shift operation of the magnetic memory according to the present embodiment.

A shift operation is performed by an instruction from the external device 2 or internal processing by the sequencer 190.

For example, if the data written in the memory cell MCA by the above-described write operation is transferred to a memory cell MC corresponding to the write address, or if the data of the memory cell MC corresponding to the read address in the above-described read operation is transferred to a memory cell MCB, a shift operation is performed.

As shown in (a) of FIG. 10, for example, before a shift operation is commenced, the memory cell MC<i−1> stores first data (for example, "0" data), and the memory cell MC<i> and the memory cell MC<i+1> store second data that differs from the first data (for example, "1" data).

The magnetization direction of the memory cell MC<i−1> differs from the magnetization direction of the memory cell MC<i>. The magnetization domain of the memory cell MC<i−1> differs from that of the memory cell MC<i>. For this reason, the domain wall DW is formed between the memory cell MC<i−1> and the memory cell MC<i>. The domain wall DW is present in the concave portion 52p.

In a shift operation, the shift circuit 160 supplies a current Isft as a shift pulse (hereinafter, a "shift current") to the magnet 5a of the memory cell unit UT. The shift current Isft has a current value and/or a pulse width that allows the domain wall DW to move for a distance corresponding to the size of a memory cell MC (a memory cell MC of one cycle).

For example, the shift current Isft flows from the memory cell MC<i+1> side (source line side) to the memory cell MC<i−1> side (bit line BL side).

Through the supply of the shift current Isft, the data in all memory cells MC in the memory cell unit UT move from the memory cell MC<i+1> side to the memory cell MC<i−1> side (from the bit line BL side to the source line SL side). The data of a memory cell MC is thus shifted to an adjacent memory cell MC.

As shown in (b) of FIG. 10, the domain wall DW moves from the concave portion 52p toward the convex portion 51.

As described in FIGS. 6 to 9, in a shift operation of the domain wall DW, if the domain wall DW moves from the concave portion 52p of one end of the memory cell MC to the convex portion 51, the volume of the domain wall DW increases as the diameters (outer diameters) D1 and D2 and the thicknesses t1 and t2 of the magnet 5a increase.

The volume change ratio (absolute value) of the domain wall DW increases as it gets close to the convex portion 51 as a result of the increase in the thickness from the concave portion 52p toward the convex portion 51 of the magnet 5a.

When (the center of) the domain wall DW reaches the convex portion 51, the volume change ratio of the domain wall DW becomes zero.

The domain wall DW passes the top of the convex portion 51 (the maximum point 91) and moves further from the convex portion 51 toward the concave portion 52q of the other end side of the memory cell MC<i>. When the domain wall DW moves from the convex portion 51 to the concave portion 52q, an absolute value of the volume change ratio of the domain wall DW becomes larger than zero.

In the present embodiment, if the thickness of the magnet 5a decreases from the convex portion 51 toward the concave portion 52q, the absolute value of the volume change ratio between the convex portion 51 and the concave portion 52q is large compared to the case where the thickness of the magnet 5a is constant.

Thus, in the present embodiment, the shift operation on the domain wall DW is performed when the domain wall DW is in a state where the domain wall DW can relatively easily move in an area between the convex portion 51 and the concave portion 52q of the magnet 5a.

The domain wall DW reaches the concave portion 52q on the other end side of the memory cell MC.

The supply of the shift current Isft is stopped in accordance with a pulse width of the shift current Isft.

As shown by (c) of FIG. 10, the domain wall DW is maintained in the concave portion 52q of the other end side of the memory cell MC<i>.

As a result of the moving of the domain wall DW, the data of the memory cells MC<i-1>, MC<i>, MC<i+1> is shifted by one cycle.

The shift operation of the magnetic memory 1 of the present embodiment is completed as described above.

If the data in the memory cell MC moves for a distance corresponding to two or more cycles, the supply of the shift current Isft is repeatedly performed.

FIG. 10 shows an example in which the domain wall DW is moved in a direction opposite to the direction in which the shift current Isft flows in the magnet 5a. The relationship between the direction in which the shift current Isft flows and the moving direction of the domain wall DW is controlled in accordance with a material used for the magnet 5a, the material that is in contact with the magnet 5a, and conditions under which the magnet 5a is formed. For this reason, the domain wall DW may move in the direction in which the shift current Isft flows in the magnet 5a, depending on the material of the magnet 5a.

(d) Summary

In the magnetic memory 1 of the present embodiment, the domain wall DW moves within the tubular magnet 5a. The tubular magnet 5a has constrictions. The magnet 5a includes a convex portion 51 having a first diameter D1 and a concave portion 52 having a second diameter D2. The maximum point 91 of the magnet 5a is provided within the convex portion 51. The minimum point 92 of the magnet 5a is provided within the concave portion 52. The second diameter (for example, an outer diameter) D2 is smaller than the first diameter (for example, an outer diameter) D1.

If the volume of the domain wall is decreased, the domain wall may be stably present in terms of magnetic energy.

If the domain wall moves within the magnet having constrictions, the domain wall relaxes at a position at which the volume of the domain wall is small in the magnet. For this reason, the domain wall moves from the convex portion (maximum point) to the concave portion (minimum point) in order to reduce the volume of the domain wall.

The domain wall has, however, a width. For this reason, the change in volume of the domain wall tends to slow down at the maximum point and the minimum point of the magnet. Therefore, the domain wall tends to move less easily in the vicinity of the maximum point and the minimum point of the magnet. As a result, there is a possibility that erroneous shifting of the domain wall may occur in a commonly used magnetic memory.

In the magnetic memory 1 of the present embodiment, the thickness t2 of the magnet 5a in the concave portion 52 is smaller than the thickness t1 of the magnet 5a in the convex portion 51. In the present embodiment, the thickness of the magnet 5a gradually decreases from the maximum point 91 toward the minimum point 92.

Thus, in the magnetic memory 1 of the present embodiment, the change in volume of the domain wall DW between the convex portion 51 and the concave portion 52 becomes relatively great.

Thus, in the present embodiment, the volume change ratio of the domain wall DW in the magnet 5a increases in the vicinity of the maximum point 91 of the convex portion 51.

As a result, in the magnetic memory 1 of the present embodiment, the domain wall DW can more easily move within the magnet 5a whose thickness decreases from the maximum point 91 toward the minimum point 92.

Therefore, the magnetic memory 1 of the present embodiment can reduce erroneous shifting of the domain wall DW.

Therefore, the magnetic memory according to the first embodiment can improve memory reliability.

(2) Second Embodiment

The magnetic memory of the second embodiment will be described with reference to FIGS. 11 to 16.

FIG. 11 is a sectional view showing an exemplary configuration of the memory cell unit in the magnetic memory 1 according to the present embodiment.

As shown in FIG. 11, in the memory cell unit UT of the magnetic memory 1 of the present embodiment, each memory cell MC includes a portion 61 which is depressed on the central axis side of the magnet in the area between the maximum point 91 and the halfway point 95 of the magnet 5b. Hereinafter, the portion 61 will be called a "depression 61".

For example, the depression 61 is provided in the convex portion 51x. The depression 61 is depressed toward the central axis side of the tubular magnet 5b. In the depression 61, the recess is formed on the outer wall of the magnet 5b. The depression 61 has a recessed surface having a certain curvature.

Figure 12:
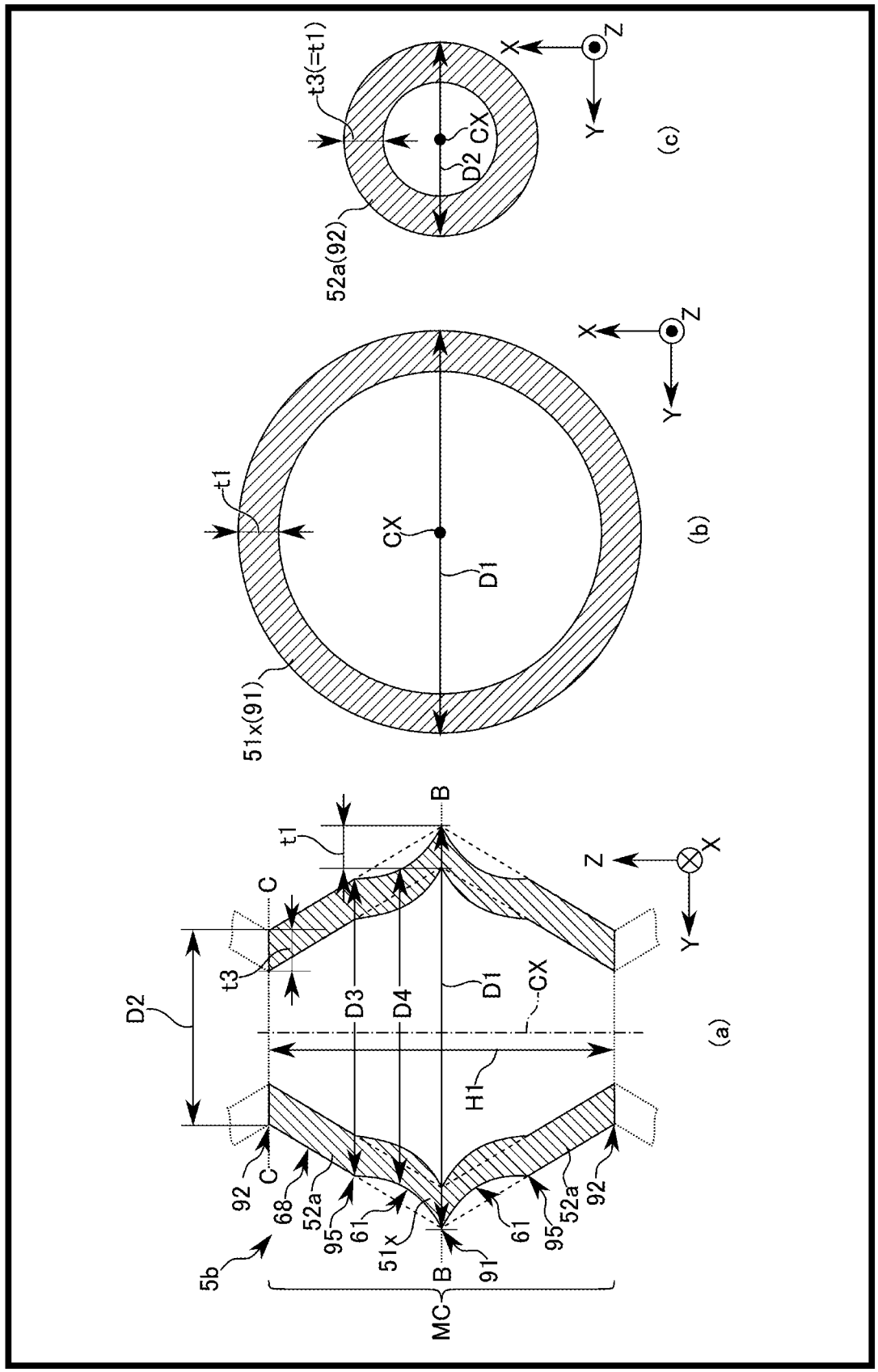
FIG. 12 is a sectional view showing an exemplary configuration of a memory cell in the magnetic memory according to the second embodiment.

FIG. 12 is a schematic diagram for explaining an exemplary structure of the memory cell of the magnetic memory according to the present embodiment. The diagram (a) of FIG. 12 is a sectional view showing an exemplary structure of the memory cell in the magnetic memory according to the present embodiment. The diagram (b) of FIG. 12 shows the top view of the cross section of line B-B in (a) of FIG. 12, viewed in the Z direction. The diagram (c) of FIG. 12 shows the top view of the cross section of line C-C in (a) of FIG. 12, viewed in the Z direction.

As shown in (a) of FIG. 12, the convex portion 51x includes a depression 61 in the magnet 5b. The depression 61 is arranged between the maximum point 91 and the halfway point 95. The depression 61 is in contact with the maximum point 91.

Each memory cell MC includes two depressions 61.

The maximum point 91 is interposed between two depressions 61 in the Z direction. The two depressions 61 have a symmetrical layout having the maximum point 91 as an axis of symmetry.

The concave portion 52a includes a tilted flat portion (hereinafter, a "tilted portion" or a "flat portion") 68 between the halfway point 95 and the minimum point 92.

The convex portion 51x has a curved structure when viewed in the X direction (or the Y direction). The concave portion 52a has a flat-plate structure when viewed in the X direction (or the Y direction).

For example, the minimum dimension D4 of the outer diameter of the depression 61 is smaller than the outer diameter D1 of the convex portion 51x and larger than the outer diameter D2 of the concave portion 52.

Due to the arranging of the depression 61, the convex portion 51x has a pointed shape toward the outer wall side of the magnet 5b. The depression 61 makes the angle of the pointed shape of the convex portion 51x in the vicinity of the maximum point 91 small compared to the case where no depression 61 is arranged. Thus, in the present embodiment, the convex portion 51*x* is more pointed in the vicinity of the maximum point 91.

As shown in (a) of FIG. 12, the convex portion 51*x* of the magnet 5*b* has a curved surface on the plane intersecting the direction parallel to the Y-Z plane between the maximum point 91 and the halfway point 95. This curved surface has a surface inside the straight line connecting the maximum point 91 and the minimum point 92 (located closer to the central axis side of the magnet 5*b*). The curve constituting the curved surface passes inside the straight line connecting the maximum point 91 and the minimum point 92 (the side closer to the central axis of the magnet 5*b*).

The magnet 5*b* (concave portion 52*a*) has a flat surface on the plane intersecting the direction parallel to the Y-Z plane between the halfway point 95 and the minimum point 92. This flat surface is constituted by lines parallel to the straight line connecting the maximum point 91 and the minimum point 92.

Thus, in the present embodiment, in the area between the maximum point 91 and the minimum point 92 of the tubular magnet 5*b*, the portion (61) having the curved surface on the maximum point 91 side is connected to the portion (52*a*) having the flat surface on the minimum point 92 side.

For example, regarding the dimension in the direction parallel to the upper surface of the substrate 9 (X direction or Y direction), the depression 61 may have a dimension D4, which is greater than the dimension D3, depending on a curvature of the curved surface included in the depression 61 (the size of the depressed area). The dimension D4 may be smaller than the dimension D3 depending on the shape of the depression 61.

As shown in (b) and (c) of FIG. 12, each of the convex portion 51*x* and the concave portion 52*a* has an annular shape when viewed in the Z direction.

For example, the thickness of the magnet 5*b* in the direction parallel to the X-Y plane (for example, the X direction or the Y direction) is constant between the maximum point 91 and the minimum point 92.

In this case, the thickness t3 of the concave portion 52*a* in the direction parallel to the X-Y plane is the same as the thickness t1 of the convex portion 51*x* (and the depression 61) in the direction parallel to the X-Y plane. The convex portion 51*x* and the concave portion 52*a* have constant thicknesses t1 and t3, respectively.

Characteristics of the magnetic memory 1 of the present embodiment are described with reference to FIGS. 13 to 16.

Figure 13:
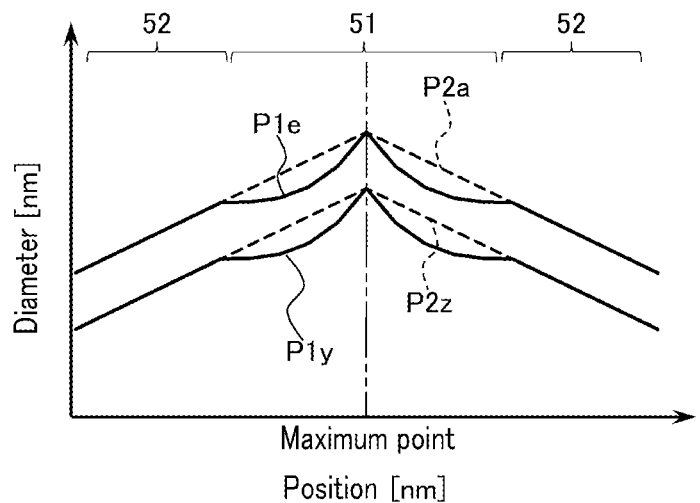
FIG. 13 is a diagram showing characteristics of the magnetic memory according to the second embodiment.

FIG. 13 is a graph indicating changes of the outer diameter and the inner diameter of the magnet in the magnetic memory 1 of the present embodiment. In the graph of FIG. 13, the vertical axis corresponds to the dimension of the magnet in the direction parallel to the upper surface of the substrate, and the horizontal axis corresponds to the position in the magnet in the direction in which the magnet extends (the moving direction of the domain wall).

In FIG. 13, the characteristics P1*e* and P1*y* indicated by solid lines indicate characteristics of the magnetic memory 1 of the present embodiment. The characteristic P1*e* corresponds to the outer diameter of the magnet. The characteristic P1*y* corresponds to the inner diameter of the magnet.

As shown by the characteristics P1*e* and P1*y* in FIG. 13, the outer diameter (and the inner diameter) of the magnet 5*b* changes in a non-linear manner between the maximum point 91 and the halfway point 95 in accordance with the curvature of the depression 61.

As a result, the change rate of the diameter of the magnet 5*b* decreases in a non-linear manner from the maximum point 91 to the minimum point 92. The change rate of the diameter of the magnet 5*b* on the convex portion 51 side is larger than that on the concave portion 52 side.

Figure 14:
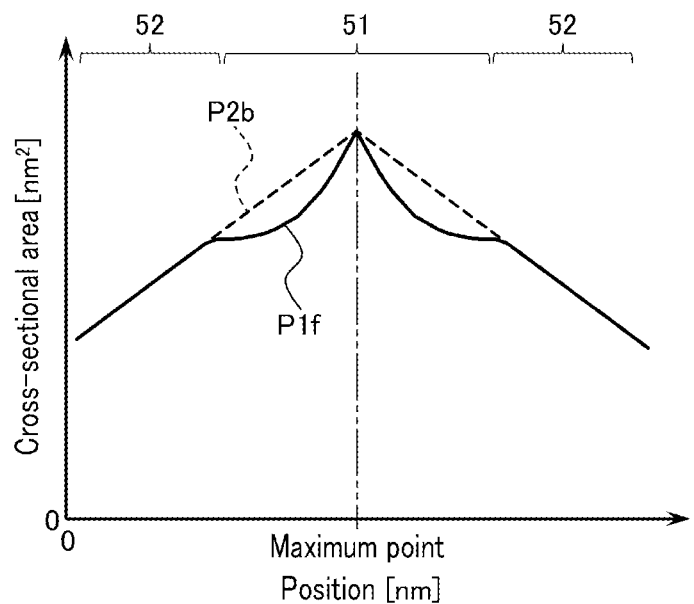
FIG. 14 is a diagram showing characteristics of the magnetic memory according to the second embodiment.

FIG. 14 is a graph indicating changes of the cross-sectional area of the magnet (domain wall) viewed in the Z direction in the magnetic memory 1 of the present embodiment. In the graph of FIG. 14, the vertical axis corresponds to the cross-sectional area, and the horizontal axis corresponds to the center position of the domain wall with respect to the extending direction of the magnet (the moving direction of the domain wall).

The characteristic P1*f* indicated by the solid line shows the characteristic of the magnetic memory 1 of the present embodiment.

As shown by the characteristic P1*f* in FIG. 14, the cross-sectional area of the magnet 5*b* in the area of the memory cell MC decreases in a non-linear manner from the maximum point 91 toward the minimum point 92, in accordance with the position of the depression 61 in the magnet 5*b*.

The cross-sectional area of the magnet 5*b* having the depression 61 decreases in the vicinity of the maximum point 91, compared to a magnet having no depression.

Herein, with regard to the change rate of the cross-sectional area of the magnet 5*b*, the change rate of the cross-sectional area on the convex portion 51 side is larger than that on the concave portion 52 side.

FIG. 15 is a graph indicating changes of the volume of the domain wall in the magnet in the magnetic memory 1 of the present embodiment. In the graph of FIG. 15, the vertical axis corresponds to the volume of the domain wall (the cross-sectional area of the domain wall in the X-Y plane integrated with respect to the width of the domain wall in the Z direction), and the horizontal axis corresponds to the center position of the domain wall in the extending direction of the magnet (the moving direction of the domain wall).

The characteristic P1*g* indicated by the solid line shows the characteristic of the magnetic memory 1 of the present embodiment.

As shown by the characteristic P1*g* in FIG. 15, the change of the volume of the domain wall DW is large in the convex portion 51*x*. The volume change ratio in the domain wall DW is distorted in accordance with the depression 61.

FIG. 16 is a graph indicating a transition of the volume change ratio of the domain wall in the magnetic memory of the present embodiment. In the graph of FIG. 16, the vertical axis corresponds to the volume change ratio of the domain wall, and the horizontal axis corresponds to the center position of the domain wall in the extending direction of the magnet (the moving direction of the domain wall). For example, the volume change ratio of the domain wall is indicated by differentiation of the volume (Vdw) of the domain wall with respect to the center position (x) of the domain wall.

The characteristic P1*h* indicated by the solid line shows the characteristic of the magnetic memory 1 of the present embodiment.

As shown by the characteristic P1*h* in FIG. 16, the volume change ratio of the domain wall DW changes in accordance with the depression 61 provided in the convex portion 51*x*. Due to the reduction of the outer diameter of the magnet 5*b* by the depression 61, the volume change ratio of the domain wall becomes small at one point.

As the outer diameter of the magnet 5*b* increases in the depression 61, the volume change ratio of the domain wall DW rapidly increases toward the maximum point 91 in accordance with the pointed shape of the convex portion 51x.

For this reason, the domain wall DW can easily move in the vicinity of the maximum point 91, following the rapid change in the volume change ratio of the domain wall DW in the vicinity of the maximum point 91.

As a result, the movement of the domain wall DW between the convex portion 51x and the concave portion 52a becomes smooth.

As described above, the volume change ratio (the absolute value) of the domain wall DW becomes small at one point in the depression 61. For this reason, it is desirable to set the shape of the depression 61 (for example, the curvature) in such a manner that the magnetic energy of the depression 61 is smaller than the energy caused by the pinning of the domain wall.

A write operation, a read operation, and a shift operation of the magnetic memory 1 according to the present embodiment are substantially the same as those described together with the magnetic memory 1 of the first embodiment; therefore, the descriptions of these operations are omitted herein.

As described above, the magnetic memory 1 of the present embodiment can reduce erroneous shifting.

The magnetic memory of the second embodiment can attain substantially the same advantages as the memory device of the first embodiment.

(3) Third Embodiment

FIGS. 17 to 22 are described as a magnetic memory according to the third embodiment.

FIG. 17 is a sectional view showing an exemplary configuration of the memory cell unit UT in the magnetic memory 1 according to the present embodiment.

As shown in FIG. 17, in the memory cell unit UT of the magnetic memory 1 of the present embodiment, each memory cell MC includes a portion 62 which is elevated on the outer periphery side of the magnet 5c in the area between the minimum point 92 and the halfway point 95 of the magnet 5c. Hereinafter, the portion 62 will be called an "elevation 62".

For example, the elevation 62 is provided in the concave portion 52x.

The elevation 62 is elevated toward the outer periphery side of the tubular magnet 5c. In the elevation 62, the recess is formed on the inner wall of the magnet 5c.

The elevation 62 has an elevated surface having a certain curvature.

Figure 18:
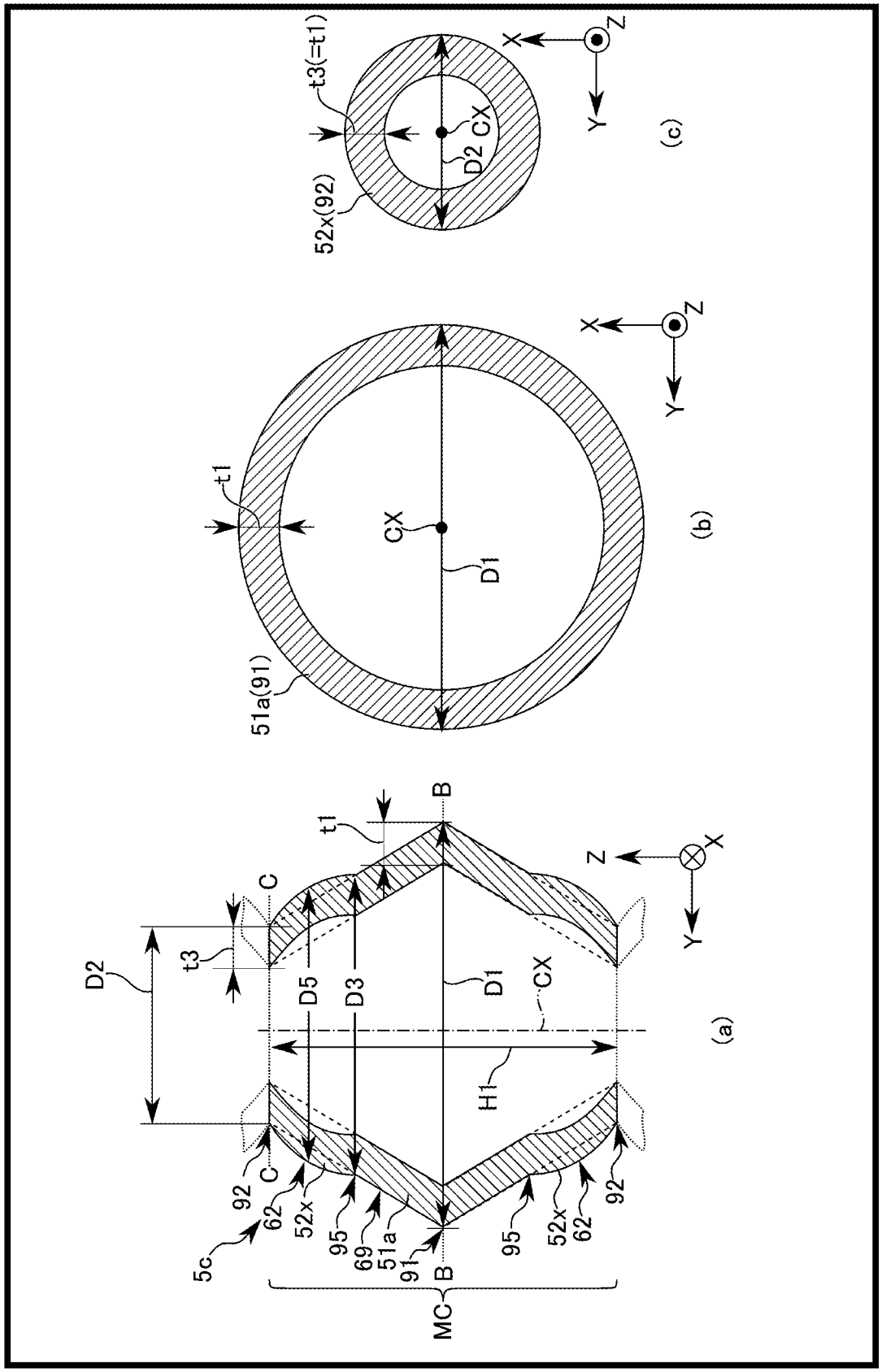
FIG. 18 is a sectional view showing an exemplary configuration of a memory cell in the magnetic memory according to the third embodiment.

FIG. 18 is a schematic diagram for explaining an exemplary structure of the memory cell of the magnetic memory according to the present embodiment. The diagram (a) of FIG. 18 is a sectional view showing an exemplary structure of the memory cell MC in the magnetic memory 1 according to the present embodiment. The diagram (b) of FIG. 18 shows the top view of the cross section of line B-B in (a) of FIG. 18, viewed in the Z direction. The diagram (c) of FIG. 18 shows the top view of the cross section of line C-C in (a) of FIG. 18, viewed in the Z direction.

As shown in (a) of FIG. 18, the concave portion 52x includes the elevation 62 in the magnet 5c. The elevation 62 is arranged between the minimum point 92 and the halfway point 95. The elevation 62 is in contact with the minimum point 92.

The minimum point 92 is interposed between two elevations 62 in the Z direction. The two elevations 62 have a symmetrical layout having the minimum point 92 as an axis of symmetry.

Each memory cell MC includes two elevations 62.

In each memory cell MC, one convex portion 51a and the maximum point 91 is interposed between two elevations 62 in the Z direction.

As described above, the outer diameter D2 of the concave portion 52x at the minimum point 92 is smaller than the outer diameter D1 of the convex portion 51a at the maximum point 91.

For example, the maximum dimension D5 of the outer diameter of the elevation 62 is smaller than the outer diameter D1 of the convex portion 51a and larger than the outer diameter D2 of the concave portion 52x.

Due to arranging of the elevation 62, the concave portion 52x has a pointed shape toward the central axis side of the magnet 5c. Thus, the valley in the vicinity of the minimum point 92 in the concave portion 52x is deep.

The convex portion 51a includes a tilted flat portion (tilted portion or flat portion) 69 between the maximum point 91 and the halfway point 95.

The convex portion 51a has a flat-plate structure when viewed in the X direction (or the Y direction). The concave portion 52x has a curved structure when viewed in the X direction (or the Y direction).

The concave portion 52x of the magnet 5c has a curved surface on the plane intersecting the direction parallel to the Y-Z plane between the minimum point 92 and the halfway point 95. This curved surface has a surface located outside the straight line connecting the maximum point 91 and the minimum point 92 (located closer to the outer periphery side of the magnet 5c).

The curve constituting the curved surface passes outside the straight line connecting the maximum point 91 and the minimum point 92 (the side closer to the outer periphery of the magnet 5c).

The magnet 5c (concave portion 52x) has a flat surface on the plane intersecting the direction parallel to the Y-Z plane between the halfway point 95 and the maximum point 91. This flat surface is constituted by lines parallel to the straight line connecting the maximum point 91 and the minimum point 92.

Thus, in the present embodiment, in the area between maximum point 91 and the minimum point 92 of the tubular magnet 5c, the portion (62) having the curved surface on the minimum point 92 side is connected to the portion (51a) having the flat surface on the maximum point 91 side.

For example, regarding the dimension in the direction parallel to the upper surface of the substrate 9 (X direction or Y direction), the elevation 62 may have a dimension D5 which is greater than the dimension D3, depending on a curvature of the curved surface (the size of the elevated area). The dimension D5 may be smaller than the dimension D3 depending on the shape of the elevation 62.

As shown in (b) and (c) of FIG. 18, each of the convex portion 51a and the concave portion 52x has an annular shape when viewed in the Z direction.

For example, the thickness of the magnet 5c in the direction parallel to the X-Y plane (for example, the X direction or the Y direction) is constant between the maximum point 91 and the minimum point 92.

In this case, the thickness t3 of the concave portion 52x (and the elevation 62) in the direction parallel to the X-Y plane is the same as the thickness t1 of the convex portion 51a in the direction parallel to the X-Y plane. The convex portion 51a and the concave portion 52x have constant thicknesses t1 and t3, respectively.

Characteristics of the magnetic memory 1 of the present embodiment are described with reference to FIGS. 19 to 22.

FIG. 19 is a graph indicating changes of the outer diameter and the inner diameter of the magnet in the magnetic memory 1 of the present embodiment. In the graph of FIG. 19, the vertical axis corresponds to the dimension of the magnet in the direction parallel to the upper surface of the substrate, and the horizontal axis corresponds to the position of the center of the domain wall in the direction in which the magnet extends (the moving direction of the domain wall).

In FIG. 19, the characteristics P1$i$ and P1$x$ indicated by solid lines indicate characteristics of the magnetic memory 1 of the present embodiment. The characteristic P1$i$ corresponds to the outer diameter of the magnet. The characteristic P1$x$ corresponds to the inner diameter of the magnet.

As shown by the characteristics P1$i$ and P1$x$ in FIG. 19, the outer diameter (and the inner diameter) of the magnet 5$c$ changes in a non-linear manner between the minimum point 92 and the halfway point 95 in accordance with the curvature of the elevation 62.

As a result, the change rate of the diameter of the magnet 5$c$ decreases in a non-linear manner from the maximum point 91 to the minimum point 92. For example, the change rate of the diameter of the magnet 5$c$ on the convex portion 51 side is larger than that on the concave portion 52 side.

FIG. 20 is a graph indicating changes of the cross-sectional area of the magnet (domain wall) viewed in the Z direction in the magnetic memory 1 of the present embodiment. In the graph of FIG. 20, the vertical axis corresponds to the cross-sectional area, and the horizontal axis corresponds to the center position of the domain wall in the extending direction of the magnet (the moving direction of the domain wall).

The characteristic P1$j$ indicated by the solid line shows the characteristic of the magnetic memory 1 of the present embodiment.

As shown by the characteristic P1$j$ in FIG. 20, the cross-sectional area of the magnet 5$c$ in the region of the memory cell MC decreases in a non-linear manner, depending on the position of the elevation 62 in the magnet 5$c$.

The cross-sectional area of the magnet 5$c$ that includes the elevation 62 is larger than the cross-sectional area of a magnet that does not include an elevation.

Herein, with regard to the change rate of the cross-sectional area of the magnet 5$c$, the change rate of the cross-sectional area on the concave portion 52 side is larger than that on the convex portion 51 side.

Figure 21:
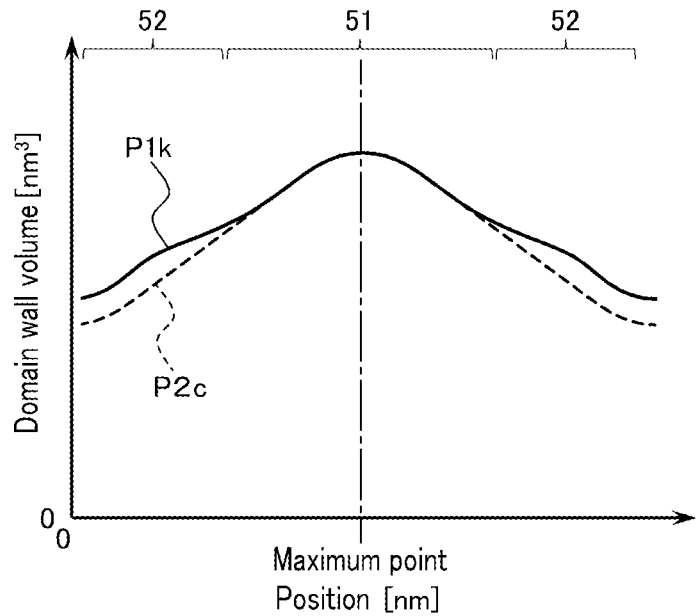
FIG. 21 is a diagram showing characteristics of the magnetic memory according to the third embodiment.

FIG. 21 is a graph indicating changes of the volume of the domain wall in the magnet in the magnetic memory 1 of the present embodiment. In the graph of FIG. 21, the vertical axis corresponds to the volume of the domain wall (the cross-sectional area of the domain wall in the X-Y plane integrated with respect to the width of the domain wall in the Z direction), and the horizontal axis corresponds to the center position of the domain wall in the extending direction of the magnet (the moving direction of the domain wall). The characteristic P1$k$ indicated by the solid line shows the characteristic of the magnetic memory 1 of the present embodiment.

As shown by the characteristic P1$k$ in FIG. 21, the change of the volume of the domain wall DW is large in the concave portion 52$x$.

Due to the arranging of the elevation 62, the volume of the concave portion 52$x$ in the vicinity of the minimum point 92 is large compared to a concave portion that does not include the elevation 62.

Figure 22:
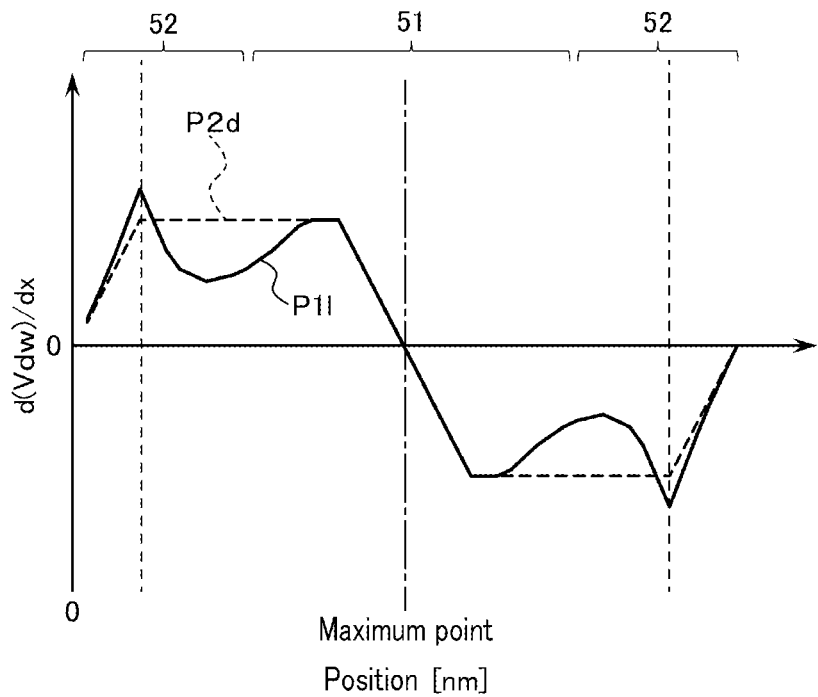
FIG. 22 is a diagram showing characteristics of the magnetic memory according to the third embodiment.

FIG. 22 is a graph indicating a transition of the volume change ratio of the domain wall in the magnetic memory of the present embodiment. In the graph of FIG. 22, the vertical axis corresponds to the volume change ratio of the domain wall, and the horizontal axis corresponds to the center position of the domain wall in the extending direction of the magnet (the moving direction of the domain wall). For example, the volume change ratio of the domain wall is indicated by differentiation of the volume of the domain wall (Vdw) with respect to the center position (x) of the domain wall. The characteristic P1$l$ indicated by the solid line shows the characteristic of the magnetic memory 1 of the present embodiment.

As shown by the characteristic P1$l$ in FIG. 22, the volume change ratio of the domain wall DW changes in accordance with the elevation 62 provided in the concave portion 52$x$. Since the elevation 62 makes the outer diameter of the magnet 5$c$ increase, the volume change ratio of the domain wall becomes large in the vicinity of the minimum point 92.

For this reason, the domain wall DW can easily move in the vicinity of the minimum point 92 in the concave portion 52$x$, because of the increase in the volume change ratio of the domain wall DW in the vicinity of the minimum point 92.

In the vicinity of the concave portion 52$x$ to which the domain wall has been moved, the volume change ratio (absolute value) of the domain wall DW becomes large due to the elevation 62.

Therefore, the domain wall DW relatively easily moves toward the minimum point 92 in the concave portion 52$x$ to which the domain wall DW has been moved.

As a result, the movement of the domain wall DW between the convex portion 51$a$ and the concave portion 52$x$ becomes smooth.

As described above, it is desirable to set the shape of the elevation 62 (for example, the curvature) in such a manner that pinning of the domain wall DW in the elevation 62 does not occur.

A write operation, a read operation, and a shift operation of the magnetic memory 1 according to the present embodiment are substantially the same as those described together with the magnetic memory 1 of the first embodiment; therefore, the descriptions of these operations are omitted herein.

As described above, the magnetic memory 1 of the present embodiment can reduce erroneous shifting.

The magnetic memory of the third embodiment can attain substantially the same advantages as the magnetic memory of the first and second embodiments.

(4) Modifications

A modification of the magnetic memory of the present embodiment will be described with reference to FIGS. 23 and 24.

In a magnetic memory 1 of the embodiment, the structure of the memory cell unit UT is not limited to the example of FIG. 3.

FIG. 23 is a sectional view showing an exemplary structure of a memory cell UT in a modification of the magnetic memory 1 of the embodiments.

As shown in FIG. 23, in the present modification, the read element (MTJ element) 20 and the selector (switching element) 30 are provided on the upper end side of the memory cell unit UT.

The MTJ element 20 and the switching element 30 are provided within an area above the field FL in the Z direction.

The conductive layer 41 is provided between the MTJ element 20 and the magnet 5a.

The MTJ element 20 is provided between the magnet 5a and the switching element 30 above the magnet 5a.

The storage layer 23 is arranged between the conductive layer 41 and the tunnel barrier layer 22. The reference layer 21 is arranged above the storage layer 23 in the Z direction, with the tunnel barrier layer 22 being interposed therebetween.

The switching element 30 may be provided above the MTJ element 20 in the Z direction. The switching element 30 is arranged between the MTJ element 20 and the bit line BL.

The conductive layer 42 is arranged between the MTJ element 20 and the switching layer 30.

In the present modification, the memory cell MCZ connected to the MTJ element is adjacent to the field line FL. For this reason, the memory cell MCZ coupled to the MTJ element 20 functions as a write cell as well as a read cell.

The magnetic memory 1 having the memory cell unit UT shown in FIG. 23 functions as a shift register in an LIFO (last-in first-out) method.

In the memory cell unit UT of FIG. 23, the memory cell MC has a structure described in the first embodiment. In the memory cell unit UT shown in FIG. 23, the structure of the memory cell MC may have the structure of the memory cell in the second embodiment (see FIGS. 11 and 12) or the structure of the memory cell MC in the third embodiment (see FIGS. 17 and 18).

FIG. 24 shows an example of a modification of the magnetic memory 1 of the embodiments.

As shown in FIG. 24, both of the depression 61 and the elevation 62 may be provided in the magnet 5z. For example, the magnet 5z does not have a curved surface in the vicinity of the halfway point 95.

For this reason, the domain wall DW can relatively easily move in both of the vicinity of the maximum point 91 and the vicinity of the minimum point 92. In the magnet 5z, the thickness of the portion on the minimum point 92 side (for example, the concave portion 52x) may be smaller than the thickness of the portion on the maximum point 91 side (e.g., the convex portion 51x).

The magnetic memory 1 of the modification shown in FIGS. 23 and 24 can achieve substantially the same advantageous effects as those described in the first to third embodiments.

Therefore, the magnetic memory according to the present modification can realize enhanced reliability.

(5) Others

In the foregoing examples, the magnet 5 (5a, 5b, 5c, or 5z) has a tubular structure. However, the magnet 5 may have a shape of a two-dimensional flat plate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
    a tubular magnet including a first portion and a second portion adjacent to the first portion in a first direction;
    a write interconnect provided separately from the magnet; and
    a read element coupled to the magnet,
    wherein
    the first portion has a first dimension of the magnet in a second direction at a first position of the magnet, the first position being a position at which a dimension of the magnet in the second direction is maximum within the first portion, the second direction being perpendicular to the first direction,
    the second portion has a second dimension of the magnet in the second direction at a second position of the magnet, the second position being a position at which a dimension of the magnet in the second direction is minimum within the second portion, the second dimension being smaller than the first dimension,
    the first portion is continuous to the second portion via a third position between the first position and the second position,
    a curve corresponding to an outer peripheral surface of the magnet extends between the first position and the third position when viewed in the second direction, and
    the curve passes through a side closer to the central axis of the magnet than a straight line connecting the first position and the second position.

2. The magnet memory according to claim 1, wherein
    the magnet includes a domain wall, and
    a volume change ratio of the domain wall at a fourth position between the first position and the third position is greater than a volume change ratio of the domain wall at the third position.

3. The magnet memory according to claim 1, wherein
    a contour corresponding to an outer peripheral surface of the second portion includes a straight line between the second position and the third position when viewed in the second direction.

4. The magnet memory according to claim 1, wherein
    the magnet includes a third portion in the first portion, the third portion being depressed toward the central axis side of the magnet.

5. The magnet memory according to claim 1, wherein
    a third dimension of the magnet at the third position in the second direction is smaller than the first dimension and larger than the second dimension, and
    a dimension between the first position and the third position in the first direction is equal to a dimension between the second position and the third position in the first direction.

6. The magnet memory according to claim 1, wherein
    the magnet includes a repetition of the first portion and the second portion in the first direction.

7. The magnet memory according to claim 1, wherein
    the write interconnect is adjacent to one end of the magnet, and
    the read element is coupled to the other end of the magnet.

8. The magnet memory according to claim 1, wherein
    a magnetization direction of the magnet is along a direction intersecting with the first direction.

9. A magnetic memory comprising:
a tubular magnet including a first portion and a second portion adjacent to the first portion in a first direction;
a write interconnect provided separately from the magnet; and
a read element coupled to the magnet,
wherein
the first portion has a first dimension of the magnet in a second direction at a first position of the magnet, the first position being a position at which a dimension of the magnet in the second direction is maximum within the first portion, the second direction being perpendicular to the first direction,
the second portion has a second dimension of the magnet in the second direction at a second position of the magnet, the second position being a position at which the dimension of the magnet in the second direction is minimum within the second portion, a second dimension being smaller than the first dimension,
the first portion is continuous to the second portion via a third position between the first position and the second position,
a cross-sectional area of a cross section perpendicular to the first direction of the magnet between the first position and the third position changes in a non-linear manner, and
a change rate of a cross-sectional area of the magnet at a fourth position located between the first position and the third position is greater than a change rate of a cross-sectional area of the magnet at the third position.

10. The magnet memory according to claim 9, wherein
a cross-sectional area of a cross section perpendicular to the first direction of the magnet between the second position and the third position changes in a linear manner.

11. The magnet memory according to claim 9, wherein
a cross-sectional area of the second portion viewed in the first direction is smaller than a cross-sectional area of the first portion viewed in the first direction.

12. The magnet memory according to claim 9, wherein
the magnet includes a domain wall, and
a volume change ratio of the domain wall at the fourth position is greater than a volume change ratio of the domain wall at a fifth position between the second position and the third position.

13. A magnetic memory comprising:
a tubular magnet including a first portion and a second portion adjacent to the first portion in a first direction;
a write interconnect provided separately from the magnet; and
a read element coupled to the magnet,
wherein
the first portion has a first dimension of the magnet in a second direction at a first position of the magnet, the first position being a position at which a dimension of the magnet in the second direction is maximum within the first portion, the second direction being perpendicular to the first direction,
the second portion has a second dimension of the magnet in the second direction at a second position of the magnet, the second position being a position at which a dimension of the magnet in the second direction is minimum within the second portion, the second dimension being smaller than the first dimension,
the first portion is continuous to the second portion via a third position between the first position and the second position, and
a change ratio of a dimension of the magnet in the second direction at a fourth position between the first position and the third position is greater than a change ratio of a dimension of the magnet in the second direction at the third position.

14. The magnet memory according to claim 13, wherein
a dimension of the magnet in the second direction between the second position and the third position is smaller than a dimension of the magnet in the second direction between the first position and the third position.

15. The magnet memory according to claim 13, wherein
the dimension of the magnet in the second direction gradually decreases from the first position toward the second position.

16. The magnet memory according to claim 13, wherein
the magnet includes a domain wall, and
a volume change ratio of the domain wall at the fourth position is greater than a volume change ratio of the domain wall at a fifth position between the second position and the third position.

17. The magnet memory according to claim 13, wherein
a third dimension of the magnet in the second direction at the third position is smaller than the first dimension and larger than the second dimension, and
a dimension of the magnet in the first direction between the first position and the third dimension is equal to a dimension of the magnet in the first direction between the second position and the third position.

* * * * *

UNITED STATES PATENT AND TRADEMARK OFFICE
CERTIFICATE OF CORRECTION

| | | |
|---|---|---|
| PATENT NO. | : 12,419,198 B2 | Page 1 of 1 |
| APPLICATION NO. | : 18/464350 | |
| DATED | : September 16, 2025 | |
| INVENTOR(S) | : Koike et al. | |

It is certified that error appears in the above-identified patent and that said Letters Patent is hereby corrected as shown below:

On the Title Page

In Item "( * ) Notice:", delete:
"This patent is subject to a terminal disclaimer."

Signed and Sealed this
Second Day of December, 2025

John A. Squires
*Director of the United States Patent and Trademark Office*